(12) United States Patent
Ha et al.

(10) Patent No.: US 9,705,040 B2
(45) Date of Patent: Jul. 11, 2017

(54) LIGHT-EMITTING DEVICE

(71) Applicant: SAMSUNG ELECTRONICS CO., LTD., Suwon-si, Gyeonggi-do (KR)

(72) Inventors: Jong-hoon Ha, Suwon-si (KR); Sang-yeob Song, Suwon-si (KR); Gi-bum Kim, Yongin-si (KR); Jae-in Sim, Yongin-si (KR); Seung-woo Choi, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/939,817

(22) Filed: Nov. 12, 2015

(65) Prior Publication Data
US 2016/0141457 A1    May 19, 2016

(30) Foreign Application Priority Data
Nov. 13, 2014   (KR) .................. 10-2014-0158055

(51) Int. Cl.
*H01L 33/38*    (2010.01)
*H01L 33/20*    (2010.01)
*H01L 33/40*    (2010.01)
*H01L 33/42*    (2010.01)

(52) U.S. Cl.
CPC ............ *H01L 33/38* (2013.01); *H01L 33/20* (2013.01); *H01L 33/405* (2013.01); *H01L 33/42* (2013.01); *H01L 2933/0016* (2013.01)

(58) Field of Classification Search
None
See application file for complete search history.

(56) References Cited

U.S. PATENT DOCUMENTS

| | | | |
|---|---|---|---|
| 6,372,608 B1 | 4/2002 | Shimoda et al. | |
| 6,417,525 B1 * | 7/2002 | Hata | ............ H01L 33/145 257/103 |
| 6,645,830 B2 | 11/2003 | Shimoda et al. | |

(Continued)

FOREIGN PATENT DOCUMENTS

| | | |
|---|---|---|
| JP | 2002-050792 A | 2/2002 |
| JP | 2013-168547 A | 8/2013 |

(Continued)

*Primary Examiner* — Hoang-Quan Ho
(74) *Attorney, Agent, or Firm* — Muir Patent Law, PLLC

(57) ABSTRACT

A light-emitting device includes: a substrate; a light-emitting structure including first and second nitride-based semiconductor layers on the substrate and an active layer between the first and second nitride-based semiconductor layers; an insulating layer on a top surface of the light-emitting structure; a protrusion on the insulating layer, a top surface of the protrusion being larger than a bottom surface thereof, the protrusion having a trapezoidal cross-section; a transparent conductive layer covering a top surface of the light-emitting structure, a top surface of the insulating layer, and the top surface of the protrusion and having a constant thickness along the top surface of the light-emitting structure, the top surface of the insulating layer, and the top surface of the protrusion; and an electrode covering at least one of inclined surfaces of the protrusion on the transparent conductive layer.

20 Claims, 15 Drawing Sheets

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,282,746 B2 | 10/2007 | Lee et al. |
| 7,288,758 B2 | 10/2007 | Sherrer et al. |
| 7,319,044 B2 | 1/2008 | Han et al. |
| 7,459,728 B2 | 12/2008 | Oohata |
| 7,482,189 B2 | 1/2009 | Lee et al. |
| 7,501,656 B2 | 3/2009 | Han et al. |
| 7,550,775 B2 | 6/2009 | Okuyama |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,704,246 B2 | 4/2014 | Lee et al. |
| 8,735,931 B2 | 5/2014 | Han et al. |
| 8,766,295 B2 | 7/2014 | Kim |
| 2013/0153950 A1 | 6/2013 | Mizutani et al. |
| 2014/0092584 A1 | 4/2014 | Ono et al. |
| 2014/0175485 A1 | 6/2014 | Liao et al. |
| 2015/0236215 A1* | 8/2015 | Park ............... H01L 33/387 257/98 |

FOREIGN PATENT DOCUMENTS

| | | |
|---|---|---|
| KR | 10-0675220 A | 11/2007 |
| KR | 10-2012-0072739 A | 7/2012 |
| KR | 10-1368687 A | 3/2014 |

\* cited by examiner

FIG. 11

LIGHT-EMITTING DEVICE

CROSS-REFERENCE TO RELATED APPLICATION

This application claims priority to and the benefit of Korean Patent Application No. 10-2014-0158055, filed on Nov. 13, 2014, in the Korean Intellectual Property Office, the disclosure of which is incorporated herein in its entirety by reference.

BACKGROUND

The inventive concept relates to a light-emitting device, and more particularly, to a light-emitting device capable of improving luminance characteristics by minimizing a phenomenon that light emitted from a light-emitting structure including a planar nitride-based semiconductor layer is re-reflected in the light-emitting device by a reflection electrode.

A light-emitting device including a planar nitride-based semiconductor layer includes a transparent conductive oxide (TCO) having a relatively low resistivity so as to emit uniform light upward from the light-emitting device. The TCO may be connected to a wiring electrode having a flat structure in order for electrical connection to a p-type nitride-based semiconductor layer. A large amount of light is generated when a large amount of current is injected into the surrounding of the wiring electrode. A metal electrode material having a high reflectivity is used for minimizing the absorption of light. However, the wiring electrode including a metal material may cause light to be re-absorbed into the light-emitting device, thus reducing light extraction efficiency.

SUMMARY

The inventive concept provides a light-emitting device that extracts light to the outside by assigning directionality to light that is re-reflected to the light-emitting device and thus disappeared due to a wiring electrode.

According to an aspect of the inventive concept, there is provided a light-emitting device including: a substrate; a light-emitting structure including first and second nitride-based semiconductor layers on the substrate, and an active layer between the first and second nitride-based semiconductor layers; an insulating layer on a top surface of the light-emitting structure; a protrusion on the insulating layer, a top surface of the protrusion being larger than a bottom surface thereof, the protrusion having a trapezoidal cross-section; a transparent conductive layer covering a top surface of the light-emitting structure, a top surface of the insulating layer, and the top surface of the protrusion; and an electrode covering at least one of inclined surfaces of the protrusion on the transparent conductive layer.

The protrusion may include a first side surface inclined at a first angle with respect to the substrate, and a second side surface inclined at a second angle with respect to the substrate, the electrode may cover a portion of the top surface of the protrusion and the second side surface of the protrusion, and the first side surface of the protrusion may be uncovered by the electrode.

The electrode may extend to cover a portion of the top surface of the insulating layer that is adjacent to the second side surface of the protrusion.

The electrode may cover a side surface of the protrusion and a portion of the top surface of the insulating layer that is adjacent to the side surface of the protrusion, with the transparent conductive layer being disposed therebetween.

The electrode may cover only a portion of the side surface of the protrusion that is adjacent to the top surface of the insulating layer.

A bottom surface of the electrode may have a height of a first level in a first region covering the top surface of the protrusion and have a height of a second level in a second region covering the top surface of the insulating layer, and the height of the first level may be higher than the height of the second level.

The protrusion may be composed of a same material as the insulating layer.

The protrusion may be composed of a same material as the transparent conductive layer.

A cross-sectional area of the top surface of the insulating layer may be larger than a cross-sectional area of the bottom surface of the protrusion.

The transparent conductive layer may have a constant thickness along the top surface of the light-emitting structure, the top surface of the insulating layer, and the top surface of the protrusion.

According to another aspect of the inventive concept, there is provided a light-emitting device including: a light-emitting structure including first and second nitride-based semiconductor layers, and an active layer between the first and second nitride-based semiconductor layers; a current blocking layer on a top surface of the light-emitting structure; a first protrusion and a second protrusion on the current blocking layer, top surfaces of the first protrusion and the second protrusion being larger than bottom surfaces thereof, the first protrusion and the second protrusion having a trapezoidal cross-section; a transparent conductive layer formed on the top surfaces of the first protrusion and the second protrusion and on a top surface of the current blocking layer; and an electrode between the first protrusion and the second protrusion on the transparent conductive layer, the electrode extending to cover a portion of the top surface of the first protrusion and a portion of the top surface of the second protrusion.

The first protrusion and the second protrusion may be spaced apart from each other by a predetermined distance.

The second protrusion may have a same shape as the first protrusion.

The first protrusion may include the top surface, a bottom surface larger than the top surface, a first side surface connecting the top surface and the bottom surface and inclined at a first angle with respect to the bottom surface, and a second side surface symmetrical to the first side surface and inclined at a second angle with respect to the bottom surface. The second protrusion may include a third side surface adjacent to the second side surface of the first protrusion and inclined at a third angle equal to the first angle, and a fourth side surface symmetrical to the third side surface and inclined at a fourth angle equal to the second angle. The electrode may not be formed on the first side surface of the first protrusion and the fourth side surface of the second protrusion. The transparent conductive layer on the first side surface of the first protrusion and the fourth side surface of the second protrusion may be exposed.

A central portion of the electrode may be formed on the current blocking layer between the first protrusion and the second protrusion, and two sides of the electrodes may cover a portion of the top surface of the first protrusion and a portion of the top surface of the second protrusion. A level of a bottom surface of the central portion of the electrode may be lower than a level of a bottom surface of the two sides of the electrode.

Each of the first protrusion and the second protrusion may be composed of a same material as one of the current blocking layer and the transparent conductive layer.

The transparent conductive layer may have a constant thickness along the top surfaces of the first protrusion and the second protrusion and the top surface of the current blocking layer.

According to another aspect of the inventive concept, there is provided a light-emitting device including a light-emitting structure including first and second nitride-based semiconductor layers, and an active layer disposed between the first and second nitride-based semiconductor layers; an insulating layer formed on the light-emitting structure; a protrusion protruding from the insulating layer in a direction away from the light-emitting structure, and having first and second inclined surfaces and a top surface intersected by the first and second inclined surfaces; an electrode covering at least a portion of the second inclined surface and not covering the entire top surface of the protrusion; and a transparent conductive layer interposed between the electrode and the protrusion, electrically connected to the first nitride-based semiconductor layer, and at least extending between opposite sides of the insulating layer to cover the protrusion and the insulating layer.

The first inclined surface of the protrusion may be uncovered by the electrode.

The transparent conductive layer may have a constant thickness.

BRIEF DESCRIPTION OF THE DRAWINGS

Exemplary embodiments of the inventive concept will be more clearly understood from the following detailed description taken in conjunction with the accompanying drawings in which:

FIG. 11 is an exploded perspective view of a backlight assembly including a light-emitting device array unit, in which light-emitting devices are arranged, according to an exemplary embodiment of the inventive concept;

DETAILED DESCRIPTION OF THE EMBODIMENTS

Figure 1:
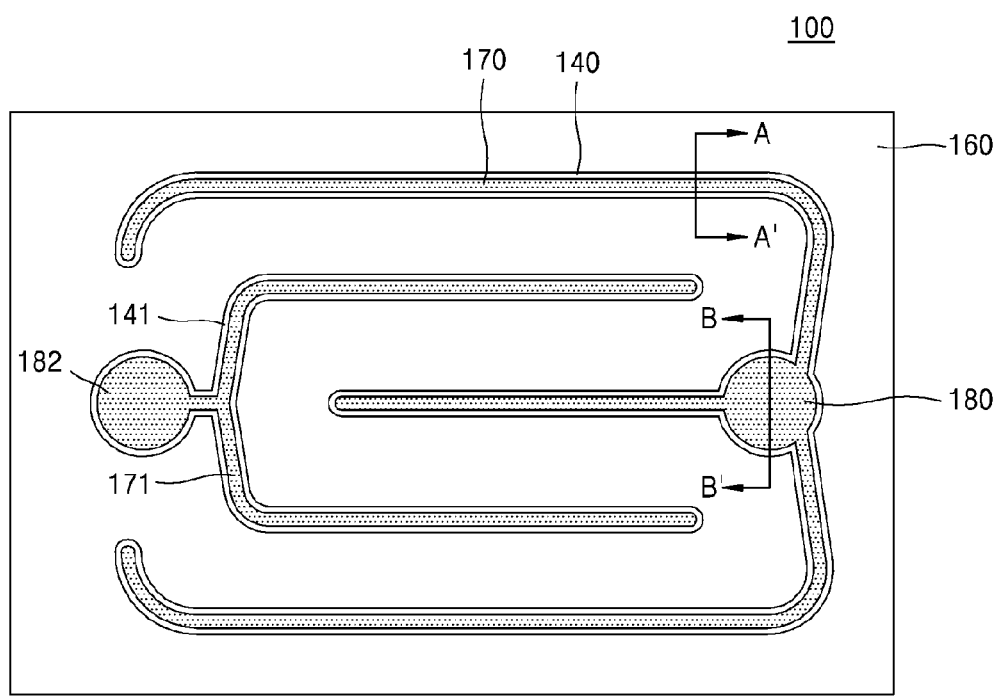
FIG. 1 is a plan view of a light-emitting device according to an exemplary embodiment of the inventive concept.

Hereinafter, embodiments of the inventive concept will be described with reference to the accompanying drawings. The inventive concept may, however, be embodied in many different forms and should not be construed as being limited to the embodiments set forth herein; rather, these embodiments are provided so that this disclosure will be thorough and complete, and will fully convey the inventive concept to those of ordinary skill in the art. It should be understood, however, that there is no intent to limit the inventive concept to the particular forms disclosed, but on the contrary, the inventive concept is to cover all modifications, equivalents, and alternatives falling within the spirit and scope of the inventive concept. Like reference numerals denote like elements throughout the specification and drawings. In the drawings, the dimensions of structures are exaggerated for clarity of the inventive concept.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms "first", "second", "third", etc. may be used herein to describe various elements, these elements should not be limited by these terms. These terms are only used to distinguish one element from another. For example, a first element may be referred to as a second element, and similarly, a second element may be referred to as a first element without departing from the scope of protection of the inventive concept.

As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Unless otherwise defined, all terms used herein have the same meaning as commonly understood by one of ordinary skill in the art to which exemplary embodiments belong.

Hereinafter, exemplary embodiments will be described in detail with reference to the accompanying drawings.

FIG. 1 is a plan view of a light-emitting device 100 according to an exemplary embodiment of the inventive concept. In the exemplary embodiment, the light-emitting device 100 may be a light-emitting diode (LED) that includes a p-type nitride-based semiconductor and an n-type nitride-based semiconductor and emits emission energy as visible light by joining the p-type nitride-based semiconductor and the n-type nitride-based semiconductor.

Referring to FIG. 1, the light-emitting device 100 may have a rectangular top surface extending in a first direction (X direction) and a second direction (Y direction). However, the top surface of the light-emitting device 100 is not limited to the rectangular shape. The light-emitting device 100 may include a first insulating layer 140, a transparent conductive layer 160, a first electrode 170, and a first electrode pad 180, which are formed on the top surface of the light-emitting device 100. The term "top surface" may mean a surface of the transparent conductive layer 160 illustrated in FIG. 1, or may mean a surface disposed at an upper portion in a third direction (Z direction) in FIGS. 2 to 7.

Figure 2:
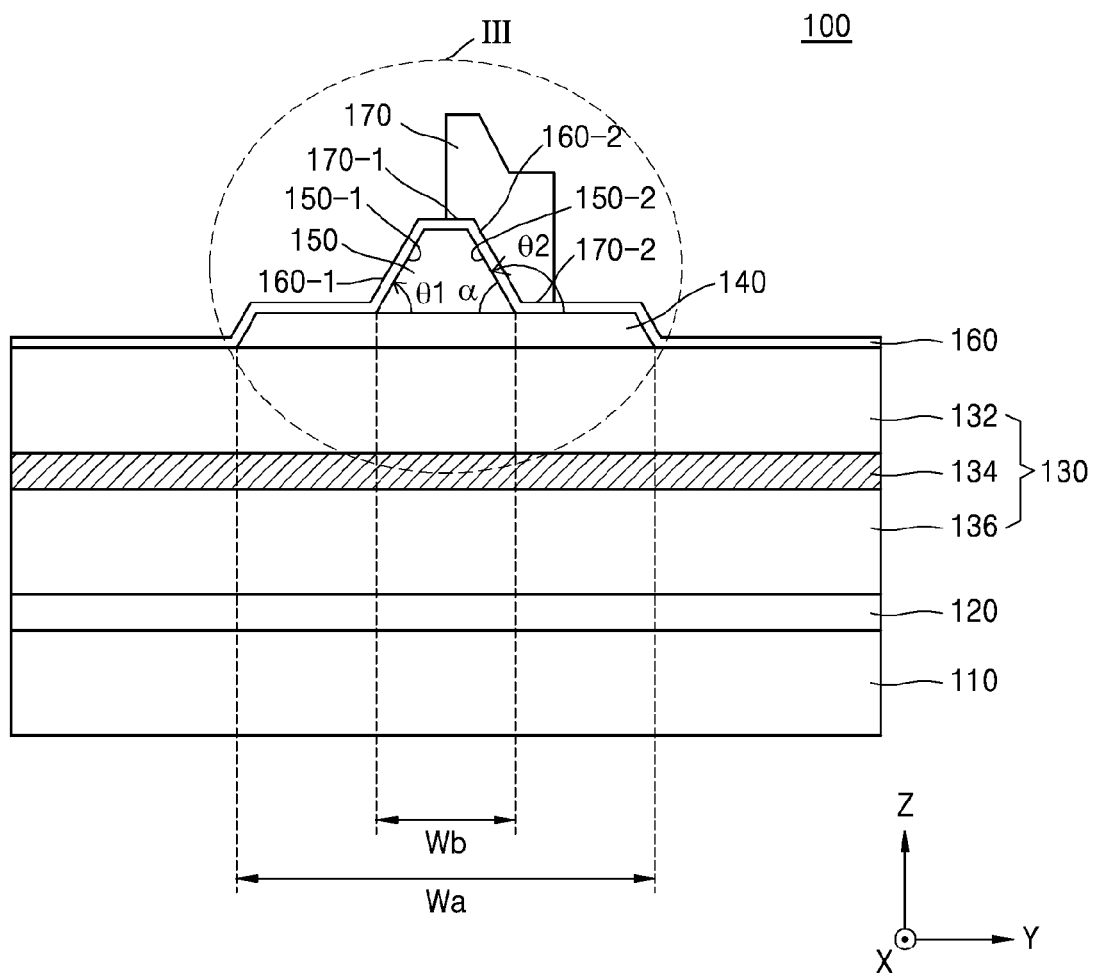
FIG. 2 is a cross-sectional view of a light-emitting device according to an exemplary embodiment of the inventive concept.

The light-emitting device 100 may further include a second electrode insulating layer 141, a second electrode 171, and a second electrode pad 182, which are electrically connected to an n-type nitride-based semiconductor layer (see 136 in FIG. 2).

The transparent conductive layer 160 may be formed over the entire top surface (but not including the regions corresponding to the second electrode 171) of the light-emitting device 100. The first electrode 170 and the first electrode pad 180 may be formed on the transparent conductive layer 160.

The first electrode 170 may extend from the transparent conductive layer 160 in the first direction (X direction) along an outer periphery of the light-emitting device 100. The first electrode 170 may be connected to the first electrode pad 180. The first electrode 170 may be electrically and/or physically connected to a first nitride-based semiconductor layer (see 132 in FIG. 2). A structure in which the first electrode 170 is connected to the first nitride-based semiconductor layer 132 will be described below in detail with reference to FIG. 2.

The second electrode 171 may be connected to the second electrode pad 182 and may extend in the first direction (X direction) such that the second electrode 171 is adjacent to the first electrode pad 180. The second electrode 171 may be surrounded by the first electrode 170 on the top surface of the light-emitting device 100.

The first electrode pad 180 may be disposed at one upper side portion of the light-emitting device 100. Although the top surface of the first electrode pad 180 is illustrated as a circular shape, the top surface of the first electrode pad 180 is not limited thereto. The electrode 180 may be electrically and/or physically connected to the first nitride-based semiconductor layer (see 132 in FIG. 2). The second electrode pad 182 may be disposed on the top surface of the light-emitting device 100 at an opposite side portion symmetrical to one side portion in which the first electrode pad 180 is disposed. The top surface of the second electrode pad 182 may have a circular shape, but is not limited thereto.

The first insulating layer 140 may be formed under the transparent conductive layer 160 and surround the first electrode 170 and the first electrode pad 180. A width of the first insulating layer 140 may be greater than a width of the first electrode 170. The second electrode insulating layer 141 may be formed to surround the second electrode 171 and the second electrode pad 182. A width of the second electrode insulating layer 141 may be greater than a width of the second electrode 171.

FIG. 2 is a cross-sectional view of the light-emitting device 100 illustrated in FIG. The cross-sectional view of FIG. 2 may be an A-A' cross-sectional view or a B-B' cross-sectional view in FIG. 1.

Referring to FIG. 2, the light-emitting device 100 may include a substrate 110, a buffer layer 120 formed on the substrate 110, a light-emitting structure 130 formed on the buffer layer 120, a first insulating layer 140 formed on a portion of a top surface of the light-emitting structure 130, a protrusion 150 protruding from a portion of a top surface of the first insulating layer 140 in a third direction (Z direction), a transparent conductive layer 160 extending to cover the top and side surfaces of the first insulating layer 140, the top surface of the protrusion 150, and an exposed portion of the top surface of the light-emitting structure 130 that is uncovered by the first insulating layer 140, and a first electrode 170 formed on the transparent conductive layer 160. The terms "upper portion", "top surface", "lower portion", "bottom surface", and "side surface" are based on the drawing and may be changed according to an actual arranging direction of the light-emitting device 100.

Hereinafter, the elements of the light-emitting device 100 will be described below in more detail.

The substrate 110 may include one selected from the group consisting of sapphire (Al2O3), silicon carbide (SiC), zinc oxide (ZnO), silicon (Si), gallium arsenide (GaAs), gallium phosphide (GaP), lithium alumina (LiAl$_2$O$_3$), boron nitride (BN), aluminium nitride (AlN), and gallium nitride (GaN). However, the material constituting the substrate 110 is not limited to the above-described material, and various materials may be used according to a material of a semiconductor layer to be formed on the substrate 110.

The buffer layer 120 may include $Al_xIn_yGa_{(1-x-y)}N$ (0≤x≤1, 0≤y≤1), such as GaN, AlN, AlGaN, InGaN, or InGaNAlN, and may include $ZrB_2$, $HfB_2$, ZrN, HfN, or TiN when necessary. In addition, a plurality of layers may be combined or a composition may be gradually changed in use. When the substrate 110 is a heterogeneous substrate, that is, when the substrate 110 is a sapphire substrate or a silicon carbide (SiC) substrate, a defect such as dislocation may be increased by a difference of a lattice constant between a material of the substrate 110 and a material of a thin film. In addition, when a temperature changes, warpage may occurs due to a difference of a thermal expansion coefficient between the material of the substrate 110 and the material of the thin film, and the warpage may cause a crack in the thin film. The buffer layer 120 may reduce the lattice mismatch problem, the warpage problem and the crack problem caused by the difference of the thermal expansion efficiency, and the like.

Figure 4:
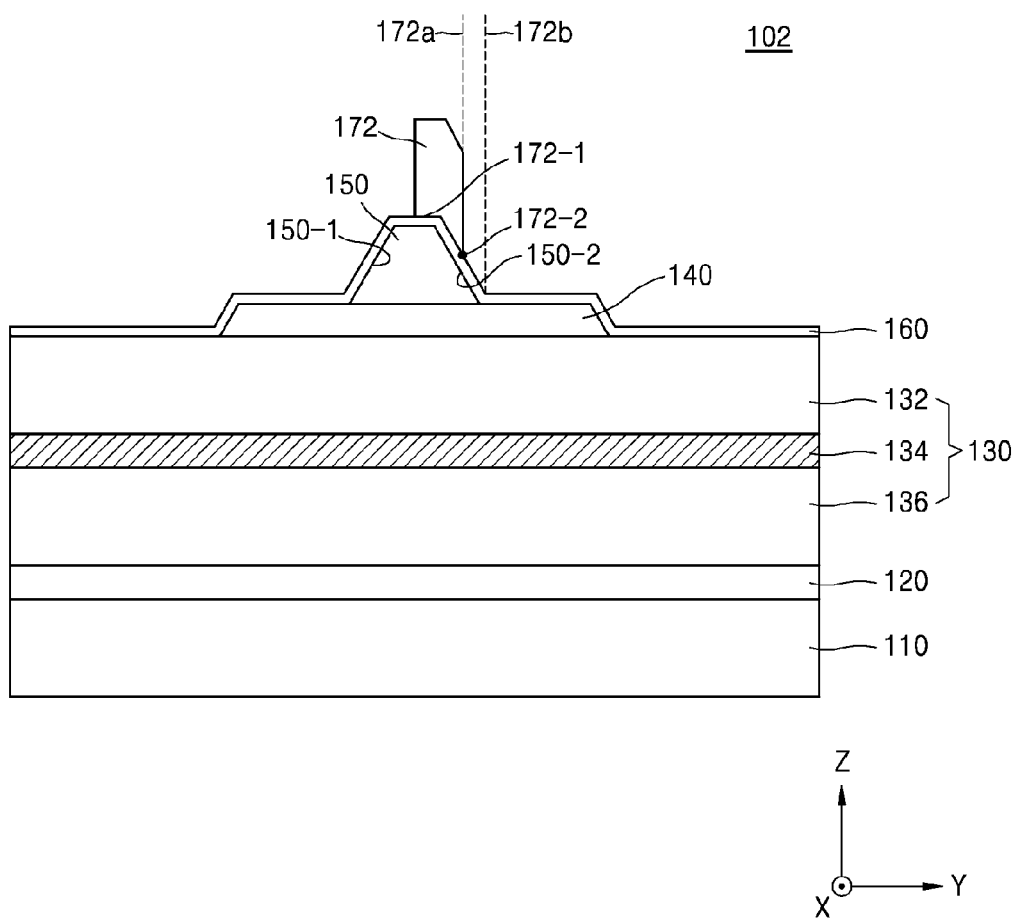
FIGS. 4 to 7 are cross-sectional views of a light-emitting device according to exemplary embodiments of the inventive concept.

The light-emitting structure 130 may include a first nitride-based semiconductor layer 132, a second nitride-based semiconductor layer 136, and an active layer 134 disposed between the first nitride-based semiconductor layer 132 and the second nitride-based semiconductor layer 136. Although the light-emitting structure 130 is illustrated in FIGS. 2 and 4 as a triple layer including the first nitride-based semiconductor layer 132, the active layer 134, and the second nitride-based semiconductor layer 136, the inventive concept is not limited thereto. The light-emitting structure 130 may be formed in a single-layer structure, a double-layer structure, or a multilayer structure of four or more layers having different compositions or thicknesses. The first nitride-based semiconductor layer 132 and the second nitride-based semiconductor layer 136 may include carrier injection layers, respectively, which are capable of improving hole injection efficiency and electron injection efficiency. In addition, the first nitride-based semiconductor layer 132 and the second nitride-based semiconductor layer 136 may have various superlattice structures. The first nitride-based semiconductor layer 132, the second nitride-based semiconductor layer 136, and the active layer 134 may be formed intermittently or continuously by using chemical vapor deposition (CVD), plasma-enhanced chemical vapor deposition (PECVD), metal-organic chemical vapor deposition (MOCVD), molecular beam epitaxy (MBE), hydride vapor phase epitaxy (HYPE), or sputtering. The first nitride-based semiconductor layer 132 and the second nitride-based semiconductor layer 136 may be respectively n-type and p-type, or may be respectively p-type and n-type. In a GaN-based compound semiconductor layer, an n-type semiconductor layer may be formed by doping silicon (Si) as an impurity and a p-type semiconductor layer may be formed by doping magnesium (Mg) as an impurity.

The second nitride-based semiconductor layer 136 may be formed on the buffer layer 120. The second nitride-based semiconductor layer 136 may further include a current diffusion layer in a region adjacent to the active layer 134. In the exemplary embodiment, the second nitride-based semiconductor layer 136 may be a nitride semiconductor satisfying n-type $Al_xIn_yGa_{(1-x-y)}N$ ($0 \leq x < 1$, $0 \leq y < 1$, $0 \leq x+y < 1$), and an n-type impurity may be silicon (Si). For example, the second nitride-based semiconductor layer 136 may be n-type GaN.

The active layer 134 is a region where electrons and holes are recombined. Due to the recombination of the electrons and the holes, an energy level is shifted to a low energy level and light having a wavelength corresponding to the energy level may be generated. The active layer 134 may include a semiconductor material having a composition of $In_xAl_yGa_{(1-x-y)}N$ ($0 \leq x \leq 1$, $0 \leq y \leq 1$, $0 \leq x+y \leq 1$), and may have a single quantum well (SQM) structure or a multi quantum well (MQW) structure. In a case where the active layer 134 has an MQW structure, more electrons are accumulated at a low energy level of a quantum well layer. Consequently, the probability of recombination of the electrons and the holes may be increased, thus improving emission efficiency. In addition, the active layer 134 may have a nano rod, a quantum wire structure, or a quantum dot structure.

The first nitride-based semiconductor layer 132 may be formed on the active layer 134. In the exemplary embodiment, the first nitride-based semiconductor layer 132 may be a p-type semiconductor layer that injects holes into the active layer 134. For example, the p-type semiconductor layer may include a semiconductor material having a composition of $In_xAl_yGa_{(1-x-y)}N$ ($0 \leq x \leq 1$, $0 \leq y \leq 1$, $0 \leq x+y \leq 1$), such as GaN, AlN, AlGaN, InGaN, InN, InAlGaN, AlInN, and a p-type dopant such as Mg, Zn, or Ba may be doped to form the p-type semiconductor layer.

The first insulating layer 140 may be formed to cover a portion of the top surface of the first nitride-based semiconductor layer 132. In the exemplary embodiment, the first insulating layer 140 may be an electron blocking layer or a current blocking layer (CBL). The first insulating layer 140 may include at least one of a metal material and an insulating material. In a case where the first insulating layer 140 is composed of a metal material, a material having lower electrical conductivity than a material of the transparent conductive layer 160 may be used so that a voltage applied to the transparent conductive layer 160 is not applied to the first insulating layer 140. The first insulating layer 140 may include at least one selected from the group consisting of silicon oxide ($SiO_2$), silicon oxynitride (SiON), silicon nitride (SiN, $Si_3N_4$), aluminium oxide ($Al_2O_3$), and titanium oxide ($TiO_x$). In the exemplary embodiment, the first insulating layer 140 may include silicon oxide whose light transmittance is 70% or more. This is suitable because as the light transmittance of the first insulating layer 140 increases, the light extraction efficiency of the light-emitting device 100 increases.

A width Wa of the cross-section of the first insulating layer 140 in the second direction (Y direction) may be different according to whether the cross-section of FIG. 2 is the A-A' cross-section or the B-B cross-section in FIG. 1. In a case where the cross-sectional view of FIG. 2 is the A-A' cross-sectional view of FIG. 1, that is, in a case where the first insulating layer 140 is formed under the first electrode 170, the width Wa of the first insulating layer 140 in the second direction (Y direction) may be in the range of about 10 μm and about 20 μm. In a case where the cross-sectional view of FIG. 2 is the B-B' cross-sectional view of FIG. 1, that is, in a case where the first insulating layer 140 is formed under the electrode 180, the width Wa of the first insulating layer 140 in the second direction (Y direction) may be in the range of about 100 μm and about 200 μm.

The protrusion 150 may be formed on the first insulating layer 140 such that the protrusion 150 contacts a portion of the top surface of the first insulating layer 140. A width of the bottom surface of the protrusion 150 may be greater than a width of the top surface of the protrusion 150. Therefore, the protrusion 150 may have a trapezoidal cross-section, a width of which is gradually narrowed in an upward direction. More specifically, a width Wb of the bottom surface of the protrusion 150 may be smaller than a width Wa of the first insulating layer 140 in the cross-section of the second direction (Y direction). In the exemplary embodiment, the width Wb of the bottom surface of the protrusion 150 may be in the range of about 5 μm to about 10 μm. The protrusion 150 may have a first side surface 150-1 and a second side surface 150-2. The first side surface 150-1 of the protrusion 150 may be inclined at a first angle θ1 with respect to the top surface of the substrate 110, and the second side surface 150-2 of the protrusion 150 may be inclined at a second angle θ2 with respect to the top surface of the substrate 110. The first angle θ1 may have an angle of about 5° to about 85° with respect to the top surface of the substrate 110, and the second angle θ2 may have an angle of about 95° to about 175° with respect to the top surface of the substrate 110. In the exemplary embodiment, the protrusion 150 may have a trapezoidal shape in which the first side surface 150-1 of the protrusion 150 is symmetrical to the second side surface 150-2 of the protrusion 150, that is, the first angle θ1 is equal to an angle α (=180°−θ2).

The protrusion 150 may be composed of the same material as the first insulating layer 140. That is, the protrusion 150 may include at least one selected from the group consisting of silicon oxide ($SiO_2$), silicon oxynitride (SiON), silicon nitride (SiN, $Si_3N_4$), aluminium oxide ($Al_2O_3$), and titanium oxide ($TiO_x$). However, the material of the protrusion 150 is not limited thereto. In the exemplary embodiment, the protrusion 150 may be composed of the same material as the insulating layer 160.

The transparent conductive layer 160 may cover the top and side surfaces of the protrusion 150, the top surface of the first insulating layer 140, and the top surface of the light-emitting structure 130 and may have a predetermined thickness. Since the transparent conductive layer 160 is formed to have a constant thickness on the top and side surface of the protrusion 150, the transparent conductive layer 160 may include a first side surface 160-1 that has the same slope as the first side surface 150-1 of the protrusion 150 and is parallel to the first side surface 150-1, and a second side surface 160-2 that has the same slope as the second side surface 150-2 and is parallel to the second side surface 150-2. The transparent conductive layer 160 may diffuse a current injected from the first electrode 170, thus preventing a current density from being concentrated on the lower portion of the first electrode 170. The transparent conductive layer 160 may have conductivity capable of diffusing the current. The transparent conductive layer 160 may include a material having a characteristic that well transmits light generated from the light-emitting structure 130, that is, a material having high light transmittance. For example, the transparent conductive layer 160 may include one selected from the group consisting of indium tin oxide (ITO), indium oxide (IO), tin oxide ($SnO_2$), zinc oxide (ZnO), indium zinc oxide (IZO), and graphene. However, the material of the transparent conductive layer 160 is not limited thereto. In some exemplary embodiments, the transparent conductive layer 160 may be composed of the same material as the protrusion 150. In this case, the transparent conductive layer 160 may be integrally formed with the protrusion 150.

The first electrode 170 may be formed to cover a portion of the top surface of the protrusion 150 and a portion of the top surface of the first insulating layer 140. The transparent conductive layer 160 may be disposed between the first electrode 170 and the top surface of the protrusion 150 and between the first electrode 170 and the top surface of the first insulating layer 140. The first electrode 170 may have a line shape that is connected to the first nitride-based semiconductor layer 132, with the transparent conductive layer 160 being disposed therebetween (see FIG. 1). The first electrode 170 may be formed in a region adjacent to the second side surface 150-2 of the protrusion 150 rather than the top surface of the protrusion 150. Although described below with reference to FIG. 3, the first electrode 170 is not formed on the first side surface 150-1 and the entire top surface of the protrusion 150, so as to prevent light generated by the light-emitting structure 130 from being re-reflected by the first electrode 170 and absorbed into the light-emitting device 100.

The bottom surface of the first electrode 170 may have a height of a first level 170-1 at a portion that covers the top surface of the protrusion 150, and may have a height of a second level 170-2 at a portion that covers the top surface of the first insulating layer 140. The height of the first level 170-1 may be higher than the height of the second level 170-2. That is, the bottom surface of the first electrode 170 may be formed to have different heights. The first electrode 170 may include a material selected from the group consisting of nickel (Ni), gold (Au), chromium (Cr), titanium (Ti), aluminium (Al), indium (In), tantalum (Ta), palladium (Pd), cobalt (Co), germanium (Ge), copper (Cu), and alloys thereof. The first electrode 170 may be formed in a single layer or a multilayer.

In a case where the cross-sectional view of FIG. 2 is the B-B' cross-sectional view of FIG. 1, the electrode pad (see 180 in FIG. 1) instead of the first electrode 170 may be formed on the first insulating layer 140 and the protrusion 150. In this case, the electrode pad (see 180 in FIG. 1) may have the same cross-section as the first electrode 170 illustrated in FIG. 2.

The light-emitting device 100 according to the exemplary embodiment may include the first insulating layer 140 formed on the light-emitting structure 130, and the protrusion 150 protruding from the first insulating layer 140 in the third direction (Z direction) and having the trapezoidal cross-section. The first electrode 170 may be formed to cover a portion of the top and side surfaces of the protrusion 150. The light-emitting device 100 may increase light emission efficiency, that is, light extraction efficiency, by preventing light generated by the light-emitting structure 130 from being re-reflected by the electrode pad or the like and re-absorbed into the light-emitting device 100. More specifically, the light-emitting device 100 includes the protrusion 150. The first side surface 150-1 of the protrusion 150 is exposed without being covered by the first electrode 170, and only the upper portion adjacent to the second side surface 150-2 of the protrusion 150 between the second side surface 150-2 of the protrusion 150 and the top surface of the protrusion 150 is covered by the first electrode 170. Thus, light travelling toward the first side surface 150-1 among the light generated from the light-emitting structure 130 may reach the second side surface 150-2, be reflected from the bottom surface of the first electrode 170, and be extracted toward the first side surface 150-1. Therefore, an amount of light re-reflected by the first electrode 170 among the light generated by the light-emitting structure 130 is reduced, increasing the light emission efficiency and improving the luminance of the light-emitting device 100. It has been experimentally confirmed that the light-emitting device 100 improved luminance by about 2% as compared with the light-emitting device having a flat electrode structure. The structure that the light generated by the light-emitting structure 130 is reflected by the first electrode 170 and extracted to the outside of the light-emitting device 100 will be described below with reference to FIG. 3.

Figure 3:
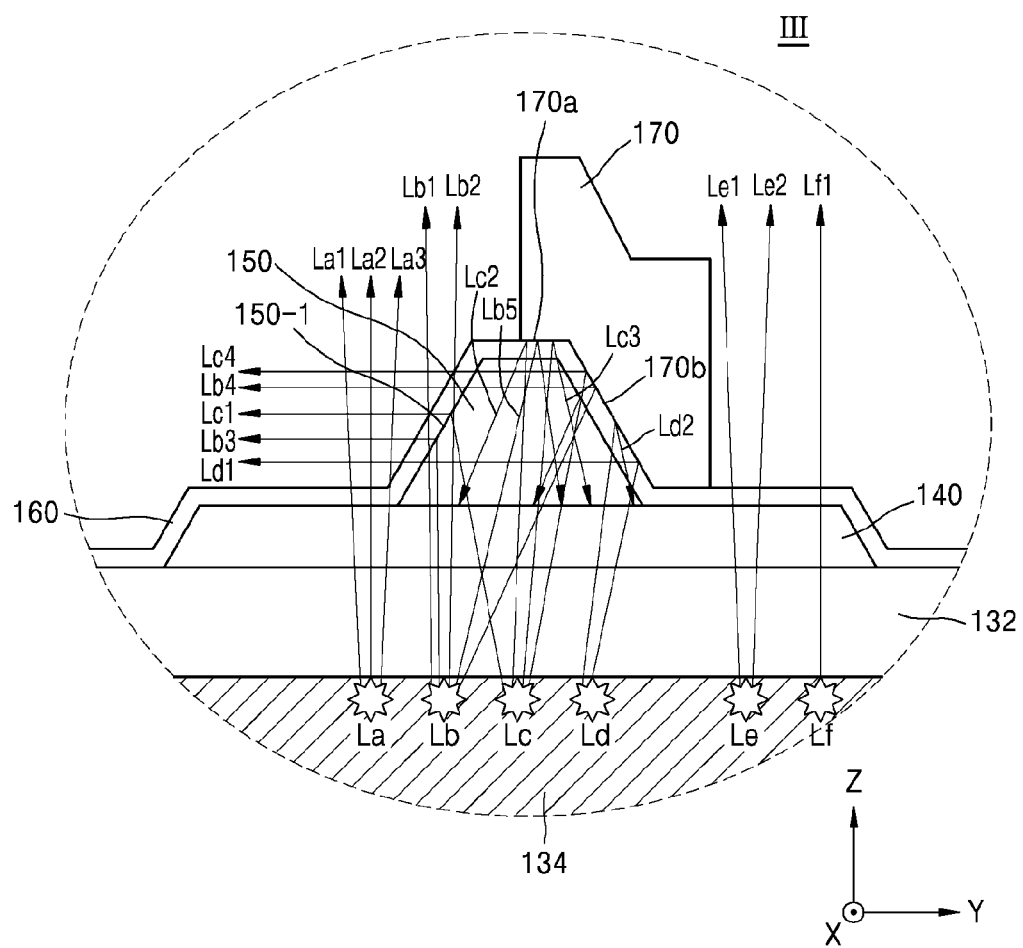
FIG. 3 is an enlarged cross-sectional view of a light-emitting device according to an exemplary embodiment of the inventive concept.

FIG. 3 is an enlarged cross-sectional view of a portion III of FIG. 2.

Referring to FIG. 3, elements illustrated in the portion III are the first nitride-based semiconductor layer 132, the active layer 134, the first insulating layer 140, the protrusion 150, the transparent conductive layer 160, and the first electrode 170. Since the listed elements have been described in detail with reference to FIG. 2, a redundant description thereof will be omitted.

The active layer 134 may generate first light La, second light Lb, third light Lc, fourth light Ld, fifth light Le, and sixth light Lf. The first light La to the sixth light Lf are illustrated for describing the phenomenon that light generated by the active layer 134 is reflected and refracted by the first electrode 170 and is extracted to the outside of the light-emitting device 100 or re-absorbed into the light-emitting device 100. The first light La to the sixth light Lf are merely the concept for convenience of description and are not the actually generated light.

Of the light generated by the recombination of electrons and holes in the active layer 134, the first light La may be emitted to the outside of the light-emitting device 100 in the third direction (Z direction) (see La1, La2, and La3). Like the first light La, a portion of the light Lb is emitted to the outside of the light-emitting device 100 in the third direction (Z direction) (see Lb1 and Lb2), but a portion of the second light Lb may reach the second bottom surface 170b of the first electrode 170, be reflected from the second bottom surface 170b of the first electrode 170, and be emitted to the outside of the light-emitting device 100 in the second direction (Y direction) (see Lb4). In addition, a portion of the second light Lb may reach the first side surface 150-1 of the protrusion 150, be refracted by the protrusion 150, and be emitted to the outside of the light-emitting device 100 in the second direction (Y direction) (see Lb3). A portion of the second light Lb may reach a first bottom surface 170a of the first electrode 170, be re-reflected from the first bottom surface 170a of the first electrode 170, and be re-absorbed into the light-emitting device 100 (see Lb5). The third light Lc may reach the first side surface 150-1 of the protrusion 150, be reflected from the first side surface 150-1 of the protrusion 150, and be emitted to the outside of the light-emitting device 100 (see Lc1). Alternatively, the third light Lc may reach the first bottom surface 170a of the first electrode 170, be re-reflected from the first bottom surface 170a of the first electrode 170, and be re-absorbed into the light-emitting device 100 (see Lc2 and Lc3). Alternatively, the third light Lc may reach the second bottom surface 170b of the first electrode 170, be refracted by the second bottom surface 170b of the first electrode 170, and be emitted to the outside of the light-emitting device 100 (see Lc4). The fourth light Ld may reach the second bottom surface 170b of the first electrode 170, be refracted in the second direction (Y direction) by the second bottom surface 170b of the first electrode 170, and be emitted to the outside of the light-emitting device 100 (see Ld1). Alternatively, the fourth light Ld may be re-reflected from the second bottom surface 170b of the first electrode 170 and be re-absorbed into the light-emitting device 100 (see Ld2). Since the fifth light Le and the sixth light Lf are not covered by the bottom surface of the first electrode 170, the fifth light Le and the sixth light Lf may be emitted to the outside of the light-emitting device 100 in the third direction (Z direction).

Of the light generated by the active layer 134, the light (see Lb4, Lc4, and Ld1), which is reflected from the second bottom surface 170b of the first electrode 170 and emitted to the outside of the light-emitting device 100 in the direction of the first side surface 150-1 of the protrusion 150, may increase the light extraction efficiency of the light-emitting device 100 and thus increase the luminance of the light-emitting device 100. That is, the light-emitting device 100 according to the exemplary embodiment includes the protrusion 150 of the trapezoidal cross-sectional shape having the first side surface 150-1 and the second side surface 150-2. Since the bottom surface of the first electrode 170 has different levels on the protrusion 150, the light generated by the active layer 134 is reflected and refracted from the first electrode 170 and is emitted toward the exposed protrusion 150 uncovered by the first electrode 170, thus improving the luminance of the light-emitting device 100.

FIG. 4 is a cross-sectional view of a light-emitting device 102 according to another embodiment of the inventive concept. The cross-sectional view of FIG. 4 may be the A-A' cross-sectional view or the B-B' cross-sectional view in FIG. 1.

Referring to FIG. 4, the light-emitting device 102 may include a substrate 110, a buffer layer 120 formed on the substrate 110, a light-emitting structure 130 formed on the buffer layer 120, a first insulating layer 140 formed on a portion of a top surface of the light-emitting structure 130, a protrusion 150 formed on the first insulating layer 140 and having a trapezoidal cross-section, and a transparent conductive layer 160 extending to cover the top surface of the protrusion 150 and an exposed portion of the light-emitting structure 130 that is uncovered by the first insulating layer 140. The light-emitting device 102 may include a first electrode 172 having a different shape from the first electrode 170 of the light-emitting device 100 illustrated in FIG. 2. Since the shapes and characteristics of the substrate 110, the buffer layer 120, the light-emitting structure 130, the first insulating layer 140, the protrusion 150, and the transparent conductive layer 160 are the same as those of the elements of the light-emitting device 100 of FIG. 2, a redundant description thereof will be omitted. Hereinafter, the first electrode 172 will be described in detail.

The first electrode 172 may extend from the transparent conductive layer 160 to cover a portion of the top surface of the protrusion 150 and cover a side surface of the protrusion 150. More specifically, the first electrode 172 may extend from the transparent conductive layer 160 to cover a portion of a second side surface 150-2 of the protrusion 150. Although the first electrode 172 is illustrated in FIG. 4 as covering a portion of the second side surface 150-2 of the protrusion 150, not the entire surface thereof (see a dashed line 172a), the first electrode 172 may extend to the dashed line 172b to entirely cover the second side surface 150-2 of the protrusion 150, according to exemplary embodiments. However, in the present exemplary embodiment, the first electrode 172 may not be covered by the protrusion 150 and may not extend to the top surface of the first insulating layer 140 covered by only the transparent conductive layer 160. That is, the first electrode 172 may not be formed on the top surface of the first insulating layer 140 where the protrusion 150 is not formed. Since a material of the first electrode 172 is the same as the material of the first electrode 170 described above with reference to FIG. 2, a redundant description will be omitted.

In the exemplary embodiment of FIG. 4, light that reaches the second side surface 150-2 of the protrusion 150 among light generated by the active layer 134 of the light-emitting device 102 may be reflected from the bottom surface of the first electrode 172 and be emitted to the first side surface 150-1 of the protrusion 150. In addition, since the top surface of the first insulating layer 140, which is not covered by the protrusion 150, is exposed, except for the transparent conductive layer 160, an amount of light emitted to the outside may increase and thus the light extraction efficiency of the light-emitting device 102 may increase.

Figure 5:
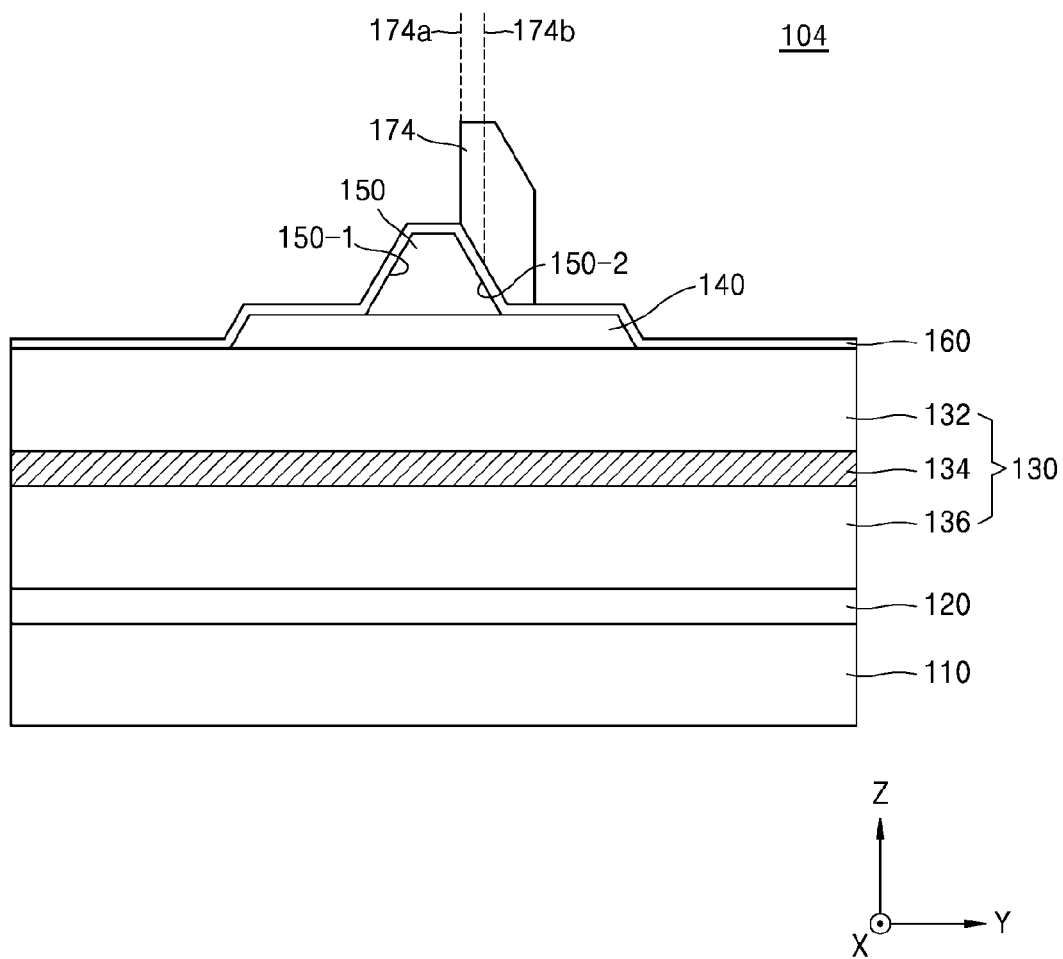

FIG. 5 is a cross-sectional view of a light-emitting device 104 according to another embodiment of the inventive concept. The cross-sectional view of FIG. 5 may be the A-A' cross-sectional view or the B-B' cross-sectional view in FIG. 1.

Referring to FIG. 5, as in FIG. 2, the light-emitting device 104 may include a substrate 110, a buffer layer 120 formed on the substrate 110, a light-emitting structure 130 formed on the buffer layer 120, a first insulating layer 140 formed on a portion of a top surface of the light-emitting structure 130, a protrusion 150 formed on the first insulating layer 140 and having a trapezoidal cross-section, and a transparent conductive layer 160 extending to cover the top surface of the protrusion 150 and an exposed portion of the top surface of the light-emitting structure 130 that is uncovered by the first insulating layer 140. Regarding the listed elements, a description redundant to the contents of FIG. 2 will be omitted. The light-emitting device 104 may include a first electrode 174 having a different shape from the first electrode 170 of the light-emitting device 100 illustrated in FIG. 2. Hereinafter, the first electrode 174 will be described in detail.

The electrode first 174 may extend from the transparent conductive layer 160 to cover a portion of the side surface of the protrusion 150 and cover the top surface of the first insulating layer 140. More specifically, the first electrode 174 may extend from the transparent conductive layer 160 to cover the top surface of the second side surface 150-2 of the protrusion 150 and cover the top surface of the first insulating layer 140 adjacent to the second side surface 150-2 of the protrusion 150. Although the first electrode 174 is illustrated in FIG. 5 as covering the entire surface of the second side surface 150-2 of the protrusion 150 (see a dashed line 174a), but is not limited thereto. In the exemplary embodiment, the first electrode 174 may cover a portion of the second side surface 150-2 of the protrusion 150 as indicated by a dashed line 174b, not the entire surface thereof. Only the transparent conductive layer 160 may be formed on the top surface of the first insulating layer 140 that is adjacent to the first side surface 150-1 of the protrusion 150. The top surface of the first insulating layer 140 that is adjacent to the first side surface 150-1 of the protrusion 150 may not be covered by the first electrode 174. Since a material of the first electrode 174 is the same as the material of the first electrode 170 described above with reference to FIG. 2, a redundant description will be omitted.

In the exemplary embodiment of FIG. 5, light that reaches the second side surface 150-2 of the protrusion 150 among light generated by the active layer 134 of the light-emitting device 104 may be reflected from the bottom surface of the first electrode 174 and be emitted to the first side surface 150-1 of the protrusion 150. In addition, of the light generated by the active layer 134, the light that passes through the first insulating layer 140 and the protrusion 150 and arrives in the direction of the top surface of the protrusion 150 or the first side surface 150-1 of the protrusion 150 may be directly emitted to the outside of the light-emitting device 104. That is, the light-emitting device 104 may minimize the surface of the first insulating layer 140 or the protrusion 150 that is covered by the first electrode 174, thus increasing the light extraction efficiency of the light-emitting device 104 and improving the luminance of the light-emitting device 104.

Figure 6:
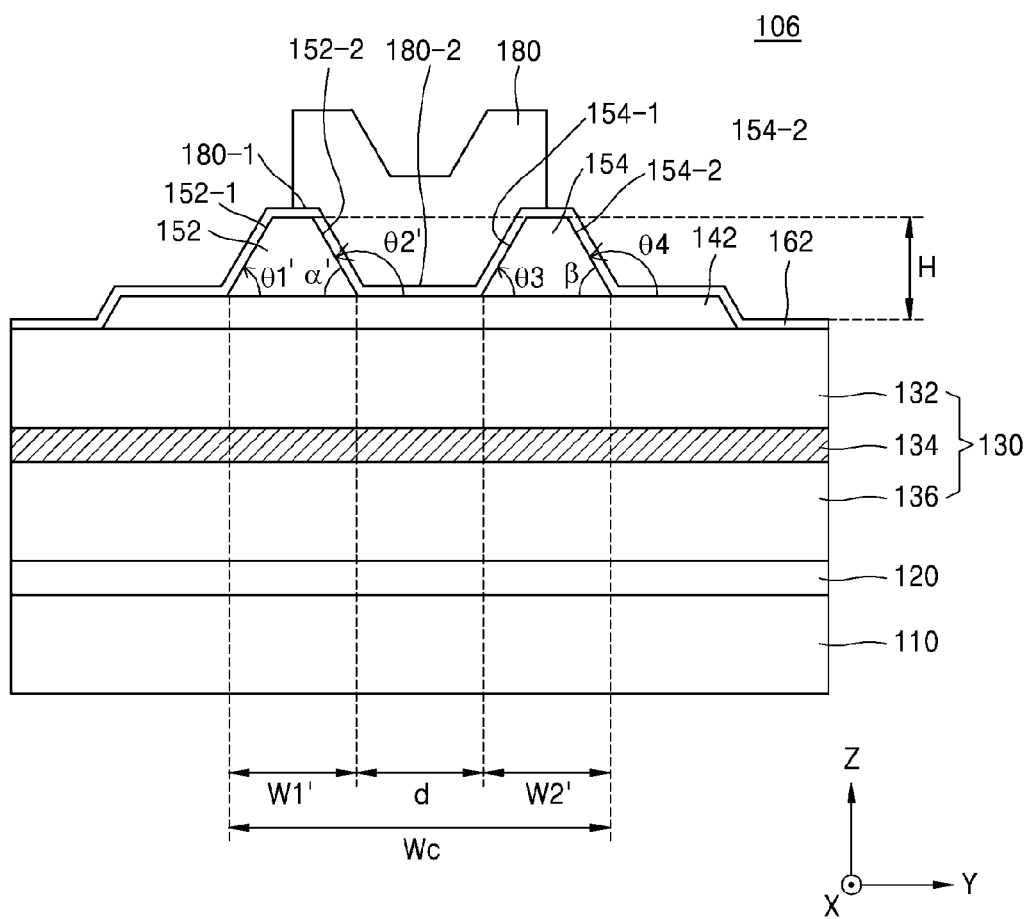

FIG. 6 is a cross-sectional view of a light-emitting device 106 according to another embodiment of the inventive concept. The cross-sectional view of FIG. 6 may be the A-A' cross-sectional view or the B-B' cross-sectional view in FIG. 1.

Referring to FIG. 6, the light-emitting device 106 may include a substrate 110, a buffer layer 120 formed on the substrate 110, a light-emitting structure 130 formed on the buffer layer 120, a first insulating layer 142 formed on a portion of a top surface of the light-emitting structure 130, a first protrusion 152 and a second protrusion 154 formed on the first insulating layer 142 and spaced apart from each other by a predetermined distance, a transparent conductive layer 162 extending to cover the top and side surfaces of the first insulating layer 142, the top surface of the first protrusion 152, the top surface of the second protrusion 154, and an exposed top surface of the light-emitting structure 130 that is uncovered by the first insulating layer 140, and an first electrode pad 180 formed on the transparent conductive layer 162. The terms "upper portion", "top surface", "lower portion", "bottom surface", and "side surface" are based on the drawing and may be changed according to an actual arranging direction of the light-emitting device 106.

The light-emitting device 106 may include the substrate 110, the buffer layer 120, and the light-emitting structure 130, which are the same elements as those of the light-emitting device 100 illustrated in and described with reference to FIG. 2. Since the substrate 110, the buffer layer 120, and the light-emitting structure 130 are the same elements as those of the light-emitting device 100, a redundant description thereof will be omitted.

On the other hand, unlike the light-emitting device 100 illustrated in and described with reference to FIG. 2, the light-emitting device 106 illustrated in FIG. 6 may further include the first insulating layer 142, the first protrusion 152, the second protrusion 154, the transparent conductive layer 162, and the first electrode pad 180.

The first insulating layer 142 may be formed to cover a portion of the top surface of the light-emitting structure 130. Specifically, the first insulating layer 142 may be formed on a first nitride-based semiconductor layer 132. In the exemplary embodiment, the first insulating layer 142 may be an electron blocking layer or a current blocking layer (CBL). The first insulating layer 142 may be composed of the same material as the first insulating layer 140 illustrated in FIG. 2. That is, the first insulating layer 142 may include at least one of a metal material and an insulating material. Since the material of the first insulating layer 142 is the same as the material of the first insulating layer 140 of FIG. 2, a redundant description will be omitted.

The first protrusion 152 and the second protrusion 154 may be formed on the first insulating layer 142 and spaced apart form each other by a predetermined distance. That is, the first protrusion 152 and the second protrusion 154 may be spaced apart form each other by a first distance d. A width of the bottom surfaces of the first and second protrusions 152 and 154 may be greater than a width of the top surfaces of the first and second protrusions 152 and 154. Therefore, the first and second protrusions 152 and 154 may have a trapezoidal cross-section, a width of which is gradually narrowed in an upward direction. Specifically, the bottom surface of the first protrusion 152 may have a first width W1' in the second direction (Y direction), and the bottom surface of the second protrusion 154 may have a second width W2' in the second direction (Y direction). In the exemplary embodiment, the first width W1' and the second width W2' may be in the range of about 5 μm to about 10 μm.

In a case where the cross-sectional view of FIG. 6 is the A-A' cross-sectional view of FIG. 1, the first distance d may be in the range of about 5 μm to about 10 μm. In this case, the sum of the widths of the first protrusion 152 and the second protrusion 154 and the first distance d may be in the range of about 15 μm to about 20 μm. In another exemplary embodiment, in a case where the cross-sectional view of FIG. 6 is the B-B' cross-sectional view of FIG. 1, the first distance d may be in the range of about 90 μm to about 100 μm. In this case, the sum of the widths of the first protrusion 152 and the second protrusion 154 and the first distance d may be in the range of about 95 μm to about 110 μm. However, the values of the widths are merely exemplary, and the first protrusion 152, the second protrusion 154, and the first distance d are not limited to the above-described values.

In the exemplary embodiment, the first protrusion 152 and the second protrusion 154 may have the same shape. Hereinafter, the following description will be focused on the structure and shape of the first protrusion 152, and a description about the second protrusion 154 redundant to the first protrusion 152 will be omitted.

The first protrusion 152 may have a first side surface 152-1 and a second side surface 152-2. The first side surface 152-1 may be inclined at a first angle θ1' with respect to the top surface of the substrate 110, and the second side surface 152-2 may be inclined at a second angle θ2' with respect to the top surface of the substrate 110. The first angle θ1' may have an angle of about 5° to about 85° with respect to the top surface of the substrate 110, and the second angle θ2' may have an angle of about 95° to about 175° with respect to the top surface of the substrate 110. The first angle θ1' and the second angle θ2' may be the same as the first angle θ1 and the second angle θ2 of FIG. 2, respectively. In the exemplary embodiment, the first protrusion 152 may have a trapezoidal shape in which the first side surface 152-1 is symmetrical to the second side surface 152-2, that is, the first angle θ1' is equal to an angle α' (=180°−θ2').

The second protrusion 154 may have a first side surface 154-1 and a second side surface 154-2. The first side surface 154-1 of the second protrusion 154 may be inclined at a third angle θ3 with respect to the top surface of the substrate 110, and the second side surface 154-2 of the second protrusion 154 may be inclined at a fourth angle θ4 with respect to the top surface of the substrate 110. The third angle θ3 may have an angle of about 5° to about 85° with respect to the top surface of the substrate 110, and the fourth angle θ4 may have an angle of about 95° to about 175° with respect to the top surface of the substrate 110. The second protrusion 154 may have a trapezoidal shape in which the first side surface 154-1 is symmetrical to the second side surface 154-2, that is, the third angle θ3 is equal to an angle β (=180°−θ4). In the exemplary embodiment, the third angle θ3 and the fourth angle θ4 may be the same as the first angle θ1' and the second angle θ2' of the first protrusion 152, respectively.

The first protrusion 152 and the second protrusion 154 may be composed of the same material as the first insulating layer 142. That is, the first protrusion 152 and the second protrusion 154 may include at least one selected from the group consisting of silicon oxide ($SiO_2$), silicon oxynitride (SiON), silicon nitride (SiN, $Si_3N_4$), aluminium oxide ($Al_2O_3$), and titanium oxide ($TiO_x$). However, the materials of the first protrusion 152 and the second protrusion 154 are not limited thereto. In the exemplary embodiment, the first protrusion 152 and the second protrusion 154 may be composed of the same material as the transparent conductive layer 162.

The transparent conductive layer 162 may cover the top and side surfaces of the first protrusion 152 and the second protrusion 154, the top surface of the first insulating layer 142, and the top surface of the light-emitting structure 130 and may have a predetermined thickness. The transparent conductive layer 162 may be composed of the same material as the transparent conductive layer 160 illustrated in FIG. 2. For example, the transparent conductive layer 162 may include one selected from the group consisting of indium tin oxide (ITO), indium oxide (IO), tin oxide ($SnO_2$), zinc oxide (ZnO), and indium zinc oxide (IZO). In some exemplary embodiments, the transparent conductive layer 162 may be composed of the same material as the first protrusion 152 and the second protrusion 154. In this case, the transparent conductive layer 162 may be integrally formed with the first protrusion 152 and the second protrusion 154.

The first electrode pad 180 may be formed to cover a portion of the top surface of the first protrusion 152, a portion of the top surface of the second protrusion 154, and a portion of the top surface of the first insulating layer 142. More specifically, the first electrode pad 180 may be formed to cover the second side surface 152-2 of the first protrusion 152, a portion of the top surface of the first protrusion 152 that is adjacent to the second side surface 152-2 of the first protrusion 152, the first side surface 154-1 of the second protrusion 154, a portion of the top surface of the second protrusion 154 that is adjacent to the first side surface 154-1, and the top surface of the transparent conductive layer 162 disposed between the first protrusion 152 and the second protrusion 154. The transparent conductive layer 162 may be disposed between the first electrode pad 180 and the top surface of the first protrusion 152, between the first electrode pad 180 and the top surface of the second protrusion 154, and between the first electrode pad 180 and the top surface of the first insulating layer 142. The first electrode pad 180 may have a circular plane surface (see FIG. 1).

The bottom surface of the first electrode pad 180 may have a height of a first level 180-1 in a region that contacts the top surface of the first protrusion 152. In the exemplary embodiment, the bottom surface of the first electrode pad 180 may have a height of a first level 180-1 that is the same as that of a plane that contacts the top surface of the first protrusion 152 in a region that contacts the top surface of the second protrusion 154. The central portion of the first electrode pad 180 may be formed on the transparent conductive layer 162 between the first protrusion 152 and the second protrusion 154, and the level of the bottom surface may have a height of a second level 180-2. The height of the first level 180-1 may be higher than the height of the second level 180-2. That is, the bottom surface of the electrode 180 may be formed to have different heights.

The first electrode pad 180 may be composed of the same material as the first electrode 170 illustrated in and described with reference to FIG. 2. For example, the first electrode pad 180 may include a material selected from the group consisting of nickel (Ni), gold (Au), chromium (Cr), titanium (Ti), aluminium (Al), indium (In), tantalum (Ta), palladium (Pd), cobalt (Co), germanium (Ge), copper (Cu), and alloys thereof.

The first electrode pad 180 illustrated in FIG. 6 illustrates a case where FIG. 6 is the B-B' cross-sectional view of FIG. 1. In a case where FIG. 6 is the A-A' cross-sectional view of FIG. 1, the first electrode 170 may be disposed instead of the first electrode pad 180.

Figure 7:
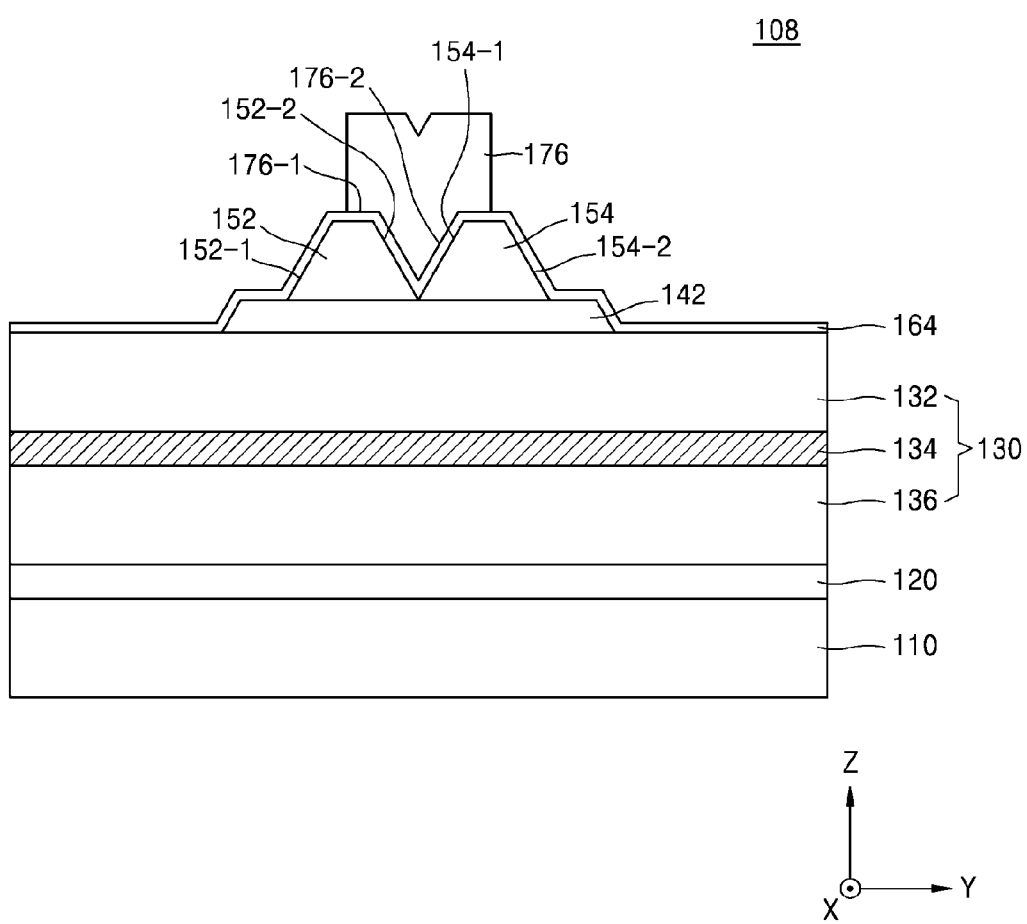

FIG. 7 is a cross-sectional view of a light-emitting device 108 according to another embodiment of the inventive concept. FIG. 7 may be the A-A' cross-sectional view of FIG. 1.

Referring to FIG. 7, the light-emitting device 108 may include a substrate 110, a buffer layer 120 formed on the substrate 110, a light-emitting structure 130 formed on the buffer layer 120, and a first insulating layer 142 formed on a portion of the top surface of the light-emitting structure 130, as in the light-emitting device 106 illustrated in FIG. 6. Regarding the listed elements, a description redundant to the contents of FIG. 6 will be omitted.

Unlike the light-emitting device 106 illustrated in FIG. 6, the light-emitting device 108 may include a first protrusion 152 and a second protrusion 154 adjacent to each other. The transparent conductive layer 164 may be formed on the first protrusion 152 and the second protrusion 154 at a constant thickness according to the shapes of the first protrusion 152 and the second protrusion 154. A first electrode 176 may be formed between the first protrusion 152 and the second protrusion 154 and cover a portion of the top surface of the first protrusion 152 and a portion of the top surface of the second protrusion 154 on the transparent conductive layer 164. Hereinafter, the first protrusion 152, the second protrusion 154, the transparent conductive layer 164, and the first electrode 176 will be described in detail.

The first protrusion 152 and the second protrusion 154 may be formed adjacent to each other on the first insulating layer 142. The second side surface 152-2 of the first protrusion 152 and the first side surface 154-1 of the second protrusion 154 may be connected together at the lower portions. The first side surface 152-1 of the first protrusion 152 and the second side surface 154-2 of the second protrusion 154 may be connected together in a V shape. That is, a region of the top surface of the first insulating layer 142 between the first protrusion 152 and the second protrusion 154 may not be exposed. Since the shapes and materials of the first protrusion 152 and the second protrusion 154 are the same as those illustrated in FIG. 6, a redundant description thereof will be omitted.

The transparent conductive layer 164 may extend to cover the top surface of the light-emitting structure 130, the top surface of the first insulating layer 142, the top surface of the first protrusion 152, and the top surface of the second protrusion 154 and may have a predetermined thickness. Since the material of the transparent conductive layer 164 is the same as that described above with reference to FIG. 6, a redundant description will be omitted.

The first electrode 176 may be formed to cover a portion of the top surface of the first protrusion 152 and a portion of the top surface of the second protrusion 154 on the transparent conductive layer 164. The first electrode 176 may not cover the first side surface 152-1 of the first protrusion 152 and the second side surface 154-2 of the second protrusion 154. That is, only the transparent conductive layer 164 may be formed on the first side surface 152-1 of the first protrusion 152 and the second side surface 154-2 of the second protrusion 154. Since the material of the first electrode 176 is the same as the material of the first electrode 170 described above with reference to FIG. 2, a redundant description will be omitted.

In the exemplary embodiment illustrated in FIG. 7, in the light-emitting device 108, the first protrusion 152 and the second protrusion 154 may not be spaced apart from each other. In this case, of the light generated by the active layer 134, an amount of light that reaches the bottom surface of the first electrode 176 and is re-reflected to the light-emitting device 108 may be reduced, thus improving the light extraction efficiency of the light-emitting device 108. In addition, the luminance of the light-emitting device 108 may be improved.

Figure 8:
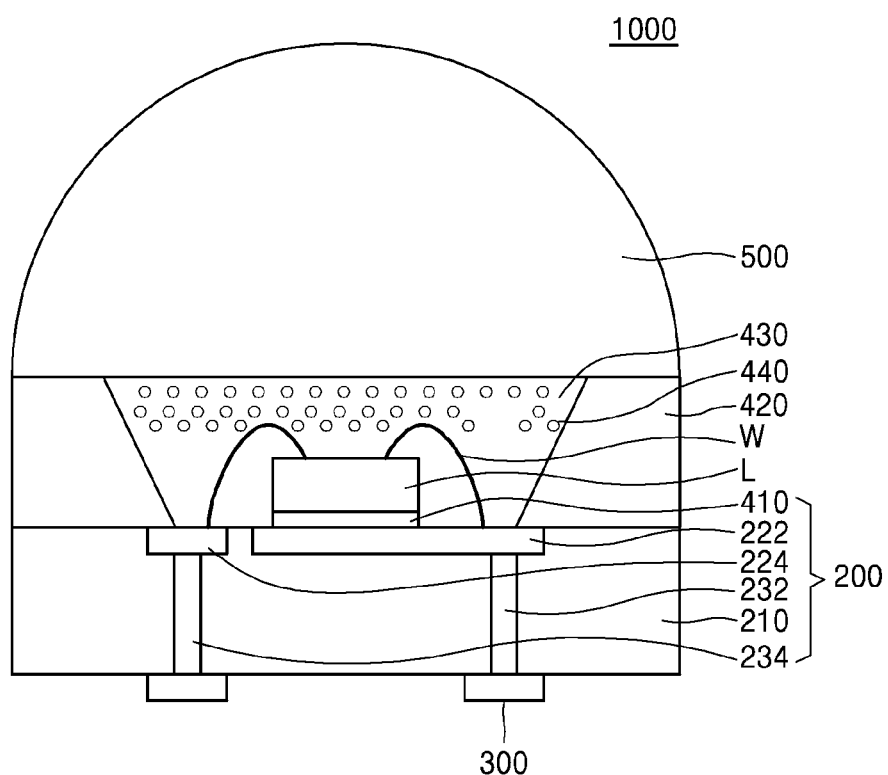
FIG. 8 is a cross-sectional view of a light-emitting device package including a light-emitting device, according to an exemplary embodiment of the inventive concept.

FIG. 8 is a cross-sectional view of a light-emitting device package 1000 including a light-emitting device, according to an exemplary embodiment of the inventive concept.

Referring to FIG. 8, the light-emitting device package 1000 may include a body 200, a light-emitting device L disposed on the body 200, with a bonding layer 410 being disposed therebetween, a reflection part 420 formed on the body 200 to surround the light-emitting device L, a resin layer 430 formed in a space between the reflection part 420 and the light-emitting device L, and a lens unit 500. The light-emitting device L may be one selected from among the light-emitting devices 100, 102, 104, 106, and 108 illustrated in FIGS. 2 to 7. In the exemplary embodiment, the light-emitting device L may be provided plurally. The light-emitting device package 1000 may further include an external connection part 300 that is connectable to an external power supply. Hereinafter, the constituent elements will be described in detail.

The body 200 may include a support 210, a first electrode connector 222, a second electrode connector 224, a first via 232, and a second via 234. The support 210 may be a heat sink that discharges heat generated in the light-emitting device package 1000, specifically heat generated in the light-emitting device L, to the outside of the light-emitting device package 1000. The first electrode connector 222 and the second electrode connector 224 may be formed on the support 210. The first electrode connector 222 and the second electrode connector 224 may be electrically connected to the light-emitting device L. The first electrode connector 222 and the second electrode connector 224 may be electrically and/or physically connected to the light-emitting device L through a wire W. In the exemplary embodiment, the first electrode connector 222 may be connected to the first electrode pad 180 of FIG. 1, and the second electrode connector 224 may be connected to the second electrode pad 182 of FIG. 1. The first via 232 and the second via 234 may be formed to penetrate between the top surface and the bottom surface of the support 210. The first via 232 and the second via 234 may respectively connect the first electrode connector 222 and the second electrode connector 224 to the external connection part 300. The external connection part 300 may be connected to an external power supply or an external electric device, so that power is supplied to the light-emitting device L and thus the light-emitting device package 1000 is allowed to emit light.

The light-emitting device L may be mounted on the body 200 by one selected from the group consisting of a wire bonding, an eutectic bonding, a die bonding, and a surface mounting technology (SMT). The bonding layer 410 may be disposed between the light-emitting device L and the top surface of the body 200. In the exemplary embodiment, the light-emitting device L may include the bonding layer 410 that is made of AuSn by a die bonding using a eutectic bonding.

The reflection part 420 may be formed at the edge of the body 200. The inner side of the reflection part 420 have an inclined shape. Since a reflection angle of light emitted from the light-emitting device L is changed according to the inclined angle of the inner side of the reflection part 420, an orientation angle of light emitted to the outside may be adjusted accordingly. The reflection part 420 may have a circular, rectangular, polygonal, or oval shape when viewed from above. However, the shape of the reflection part 420 is not limited thereto. The reflection part 420 may include at least one selected from the group consisting of a resin material such as polyphthalamide (PPA), silicon (Si), aluminium (Al), aluminium nitride (AlN), photo sensitive glass (PSG), polyamide 9T (PA9T), syndiotactic polystyrene (SPS), a metal material, sapphire ($Al2O_3$), beryllium oxide (BeO), a printed circuit board (PCB), and ceramic. The reflection part 420 may be formed by injection molding, etching, or the like.

The resin layer 430 may fill a cavity and may include a phosphor 440. The resin layer 430 may be made of a resin material including transparent silicone or epoxy. The phosphor 440 may be selected according to a wavelength of light generated by the light-emitting device L, so that the light-emitting device package 1000 emits white light. The phosphor 440 may be one selected from among a blue phosphor, a blue-green phosphor, a green phosphor, a yellow-green phosphor, a yellow phosphor, a yellow-red phosphor, an orange phosphor, and a red phosphor. The phosphor 440 and the wavelength of the light generated by the light-emitting device L will be described below in detail with reference to FIG. 9.

Figure 9:
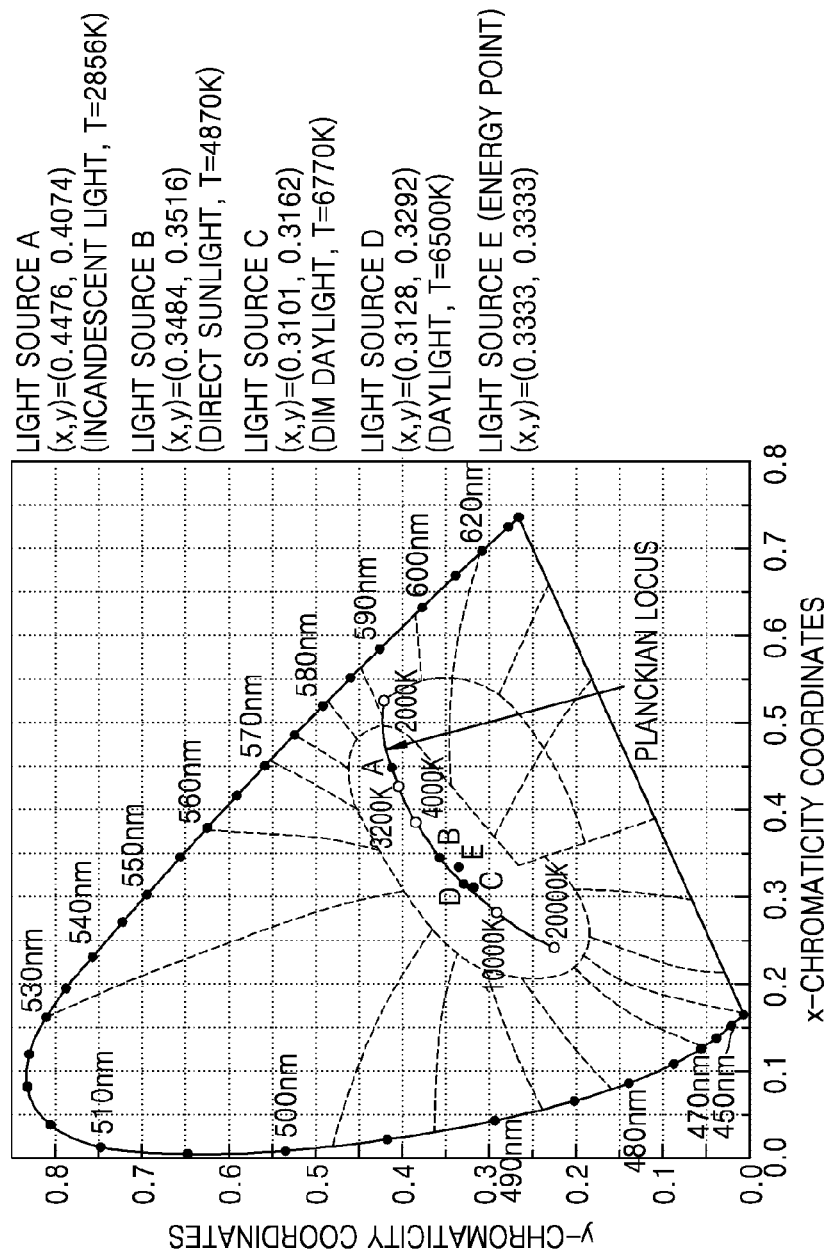
FIG. 9 illustrates a CIE 1931 coordinate system for describing various examples of a wavelength conversion material adoptable to a phosphor layer of a light-emitting device package, according to an exemplary embodiment of the inventive concept.

FIG. 9 illustrates the CIE 1931 coordinate system for describing various examples of the wavelength conversion material adoptable to the phosphor 440 of the light-emitting device package 1000, according to an exemplary embodiment of the inventive concept.

In the exemplary embodiment, the light-emitting device (L in FIG. 8) may be an LED that emits blue light. Also, the phosphor (440 in FIG. 4) may convert the blue light emitted by the light-emitting device L to at least one selected from the group consisting of a yellow color, a green color, a red color, and an orange color, and mix the blue light with the unconverted blue light to emit white light.

On the other hand, when the light-emitting device (L in FIG. 8) emits ultraviolet light, the phosphor may include phosphors that emit blue light, green light, and red light. In this case, the light-emitting device package 1000 including the phosphor 440 may adjust a color rendering index (CRI) from 40 to 100. The light-emitting device package 1000 may generate a variety of white light having a color temperature of about 2000K to about 20,000K. If necessary, the light-emitting device package 1000 may adjust an illumination color according to a surrounding atmosphere or a mood by generating infrared light or visible light, such as a violet color, a blue color, a red color, and an orange color. In addition, the light-emitting device package 1000 may generate light of a specific wavelength so as to promote the growth of plants.

In the CIE 1931 coordinate system illustrated in FIG. 9, (x, y) coordinates of light generated by a package module constituted by one or more package selected from the group consisting of a white light-emitting package including at least one selected from a yellow phosphor, a green phosphor, and a red phosphor in the light-emitting device (L in FIG. 8) emitting blue light, a green or red light-emitting package including at least one selected from a green phosphor and a red phosphor in the light-emitting device emitting blue light, a green light-emitting device package including no phosphor, and a red light-emitting device package including no phosphor may be positioned on the line segment connecting (0.4476, 0.4074), (0.3484, 0.3516), (0.3101, 0.3162), (0.3128, 0.3292), (0.3333, 0.3333). Alternatively, the (x, y) coordinates may be positioned in a region surrounded by the line segment and a black-body radiator spectrum. A color temperature of the white light may be in the range of about 2000K to about 20,000K.

Figure 10:
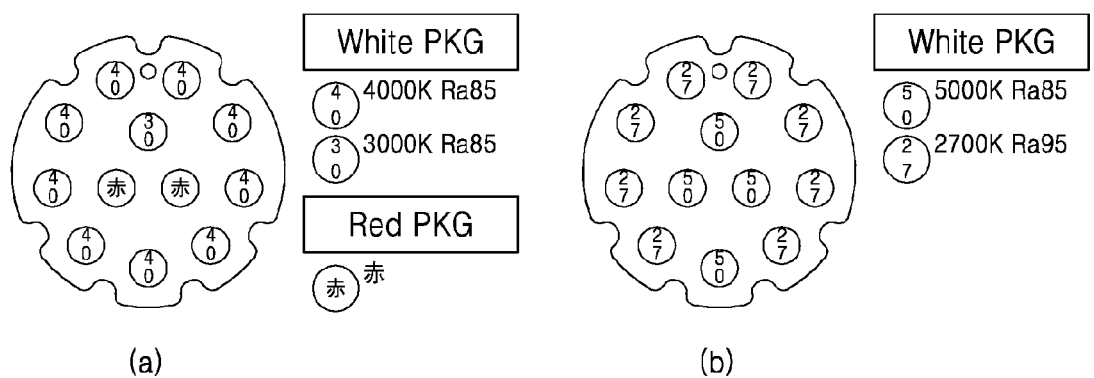
FIG. 10 is a diagram of a light-emitting device package according to an exemplary embodiment of the inventive concept.

FIG. 10 illustrates a light-emitting device package 1000 including the light-emitting device L of FIG. 8.

Referring to FIG. 10, for example, if a white light-emitting device package having a color temperature of 4000K and a red light-emitting device package having a color temperature of 2000K are combined, it is possible to manufacture a white light-emitting package module that is capable of adjusting a color temperature in the range of about 2000K and about 4000K and has a CRI of about 85 to about 99.

As another example, if a white light-emitting device package having a color temperature of 2700K and a white light-emitting device package having a color temperature of 5000K are combined, it is possible to manufacture a white light-emitting package module that is capable of adjusting a color temperature in the range of about 2700K and about 5000K and has a CRI of about 85 to about 99. The number of light-emitting device packages having different color temperatures may be changed according to a basic color temperature setting value. When a basic setting value of a lighting apparatus is about a color temperature of 4000K, the number of packages corresponding to 4000K is larger than the number of red light-emitting device packages having a color temperature of 2000K.

The phosphor (440 in FIG. 8) may have the following empirical formulas and colors.

Oxide: yellow color and green color $Y_3Al_5O_{12}$:Ce, $Tb_3Al_5O_{12}$:Ce, $Lu_3Al_5O_{12}$:Ce Silicate: yellow color and green color $(Ba,Sr)_2SiO_4$:Eu, yellow color and orange color $(Ba,Sr)_3SiO_5$:Ce Nitride: green color $\beta$-SiAlON:Eu, yellow color $L_3Si_6O_{11}$:Ce, orange color $\alpha$-SiAlON:Eu, red color $CaAlSiN_3$:Eu, $Sr_2Si_5N_8$:Eu, $SrSiAl_4N_7$:Eu, $SrLiAl_3N_4$:Eu, $$Ln_{4-x}(Eu_zM_{1-z})_xSi_{12-y}Al_yO_{3+x+y}N_{18-x-y} \ (0.5 \leq x \leq 3, \ 0 < z < 0.3, \ 0 < y \leq 4) \quad (1)$$

In Formula (1), Ln may be at least one element selected from the group consisting of group Ma elements and rare-earth elements, and M may be at least one element selected from the group consisting of calcium (Ca), barium (Ba), strontium (Sr), and magnesium (Mg).

Fluoride: KSF-based red color $K_2SiF_6$:Mn4+, $K_2TiF_6$:Mn4+, $NaYF_4$:Mn4+, $NaGdF_4$:Mn4+

The composition of the phosphor (440 in FIG. 8) needs to basically conform with stoichiometry, and the respective elements may be partially or entirely substituted by other elements included in the respective groups of the periodic table. For example, strontium (Sr) may be partially or entirely substituted by at least one selected from the group consisting of barium (Ba), calcium (Ca), and magnesium (Mg) of alkaline-earth group II, and Y may be partially or entirely substituted by at least one selected from the group terbium (Tb), lutetium (Lu), scandium (Sc), and gadolinium (Gd). In addition, europium (Eu), which is an activator, may be partially or entirely substituted by at least one selected from the group consisting of cerium (Ce), terbium (Tb), praseodymium (Pr), erbium (Er), and ytterbium (Yb) according to a desired energy level. The activator may be applied solely or a sub activator may be additionally applied to change characteristics.

Furthermore, as phosphor alternatives, materials such as quantum dot (QD) may be applied. A phosphor and a QD may be used in an LED solely or in combination.

The quantum dot may have a structure including a core (3 nm to 10 nm) such as CdSe or InP, a shell (0.5 nm to 2 nm) and a core such as ZnS or ZnSe, or a ligand for stabilizing a shell and may implement various colors according to sizes.

Table 1 below shows types of phosphors (440 in FIG. 8) according to applications of a white light-emitting device using a blue LED (440 nm to 460 nm) and a UV (380 nm to 440 nm).

TABLE 1

| Usage | Phosphor |
|---|---|
| LED TV BLU | $\beta$-SiAlON:Eu2+ |
| | (Ca, Sr)AlSiN3:Eu2+ |
| | L3Si6O11:Ce3+ |
| | K2SiF6:Mn4+ |
| | K2TiF6:Mn4+ |
| | NaYF4:Mn4+ |
| | NaGdF4:Mn4+ |
| | SrLiAl3N4:Eu |
| | $Ln_{4-x}(Eu_zM_{1-z})_xSi_{12-y}Al_yO_{3+x+y}N_{18-x-y}$ |
| | $(0.5 \leq x \leq 3, 0 < z < 0.3, 0 < y \leq 4)$ (1) |
| Illumination | Lu3Al5O12:Ce3+ |
| | Ca-$\alpha$-SiAlON:Eu2+ |
| | L3Si6N11:Ce3+ |
| | (Ca, Sr)AlSiN3:Eu2+ |
| | Y3Al5O12:Ce3+ |
| | K2SiF6:Mn4+ |
| | K2TiF6:Mn4+ |
| | NaYF4:Mn4+ |
| | NaGdF4:Mn4+ |
| | SrLiAl3N4:Eu |
| | $Ln_{4-x}(Eu_zM_{1-z})_xSi_{12-y}Al_yO_{3+x+y}N_{18-x-y}$ |
| | $(0.5 \leq x \leq 3, 0 < z < 0.3, 0 < y \leq 4)$ (1) |
| Side View (Mobile, Note PC) | Lu3Al5O12:Ce3+ |
| | Ca-$\alpha$-SiAlON:Eu2+ |
| | L3Si6N11:Ce3+ |
| | (Ca, Sr)AlSiN3:Eu2+ |
| | Y3Al5O12:Ce3+ |
| | (Sr, Ba, Ca, Mg)2SiO4:Eu2+ |
| | K2SiF6:Mn4+ |
| | K2TiF6:Mn4+ |
| | NaYF4:Mn4+ |
| | NaGdF4:Mn4+ |
| | SrLiAl3N4:Eu |

TABLE 1-continued

| Usage | Phosphor |
|---|---|
| Electrical Component (Head Lamp, etc.) | $Ln_{4-x}(Eu_zM_{1-z})_xSi_{12-y}Al_yO_{3+x+y}N_{18-x-y}$ $(0.5 \leq x \leq 3, 0 < z < 0.3, 0 < y \leq 4)$ (1) Lu3Al5O12:Ce3+ Ca-α-SiAlON:Eu2+ L3Si6N11:Ce3+ (Ca, Sr)AlSiN3:Eu2+ Y3Al5O12:Ce3+ K2SiF6:Mn4+ K2TiF6:Mn4+ NaYF4:Mn4+ NaGdF4:Mn4+ SrLiAl3N4:Eu $Ln_{4-x}(Eu_zM_{1-z})_xSi_{12-y}Al_yO_{3+x+y}N_{18-x-y}$ $(0.5 \leq x \leq 3, 0 < z < 0.3, 0 < y \leq 4)$ (1) |

In Formula (1) of Table 1, Ln may be at least one element selected from the group consisting of group Ma elements and rare-earth elements, and M may be at least one element selected from the group consisting of calcium (Ca), barium (B a), strontium (Sr), and magnesium (Mg).

The phosphors (440 in FIG. 8) or quantum dots may be applied by using at least one selected from the group consisting of a method of spraying phosphors or quantum dots on a light-emitting device, a method of covering as a film, and a method of attaching as a sheet of film or ceramic phosphor.

As the spraying method, dispensing or spray coating is commonly used. The dispensing includes a pneumatic method and a mechanical method such as screw or linear type. Through a jetting method using a piezoelectric field effect, an amount of dotting may be controlled through a very small amount of discharging and color coordinates may be controlled therethrough. In case of a method of collectively applying phosphors on a wafer level or on a light-emitting device by using a spray method, productivity may be enhanced and a thickness may be easily controlled.

The method of covering phosphors or quantum dots as a film on a light-emitting device may include electrophoresis, screen printing, or a phosphor molding method, and these methods may have a difference according to whether a lateral surface of a chip is required to be coated.

When two or more types of phosphor layers having different light-emitting wavelengths are stacked, a distributed Bragg reflector (DBR) (ODR) layer may be included between the respective layers in order to minimize wavelength re-absorption and interference between the light-emitting device (L in FIG. 8) and the phosphor (440 in FIG. 8). In order to form a uniform coated film, after a phosphor is fabricated as a film or a ceramic form and attached to a chip.

In order to differentiate light efficiency and light distribution characteristics, a phosphor layer serving as a light conversion material may be positioned in a remote form, and in this case, the light conversion material may be positioned together with a material such as a light-transmissive polymer, glass, or the like, according to durability and heat resistance.

A phosphor applying technique plays the most important role in determining light characteristics in a light-emitting device, so techniques of controlling a thickness of a phosphor application layer, a uniform phosphor distribution, and the like, have been variously researched.

A quantum dot may also be positioned in a light-emitting device in the same manner as that of a phosphor, and may be positioned in glass or light-transmissive polymer material to perform optical conversion.

Figure 11:
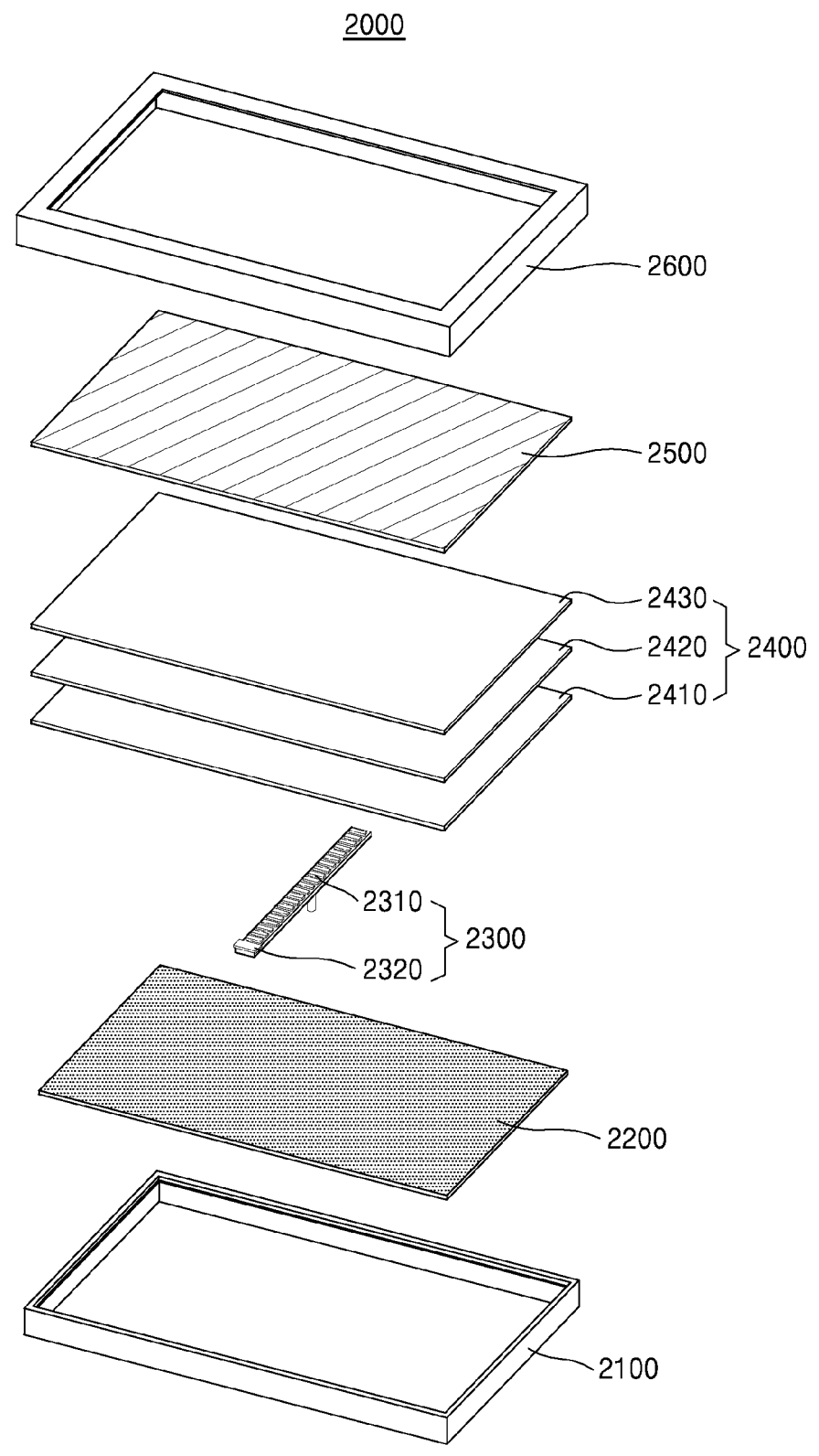

FIG. 11 is an exploded perspective view of a direct-type backlight assembly 2000 including a light-emitting device array unit in which at least one selected from among the light-emitting devices 100, 102, 104, 106, and 108 of FIGS. 2 to 7 is arranged, according to an exemplary embodiment of the inventive concept.

Referring to FIG. 11, the direct-type backlight assembly 2000 may include a lower cover 2100, a reflection sheet 2200, a light-emitting module 2300, an optical sheet 2400, a liquid crystal panel 2500, and an upper cover 2600. In the exemplary embodiment, the light-emitting device array unit may be used as the light-emitting module 2300 included in the direct-type backlight assembly 2000.

In the exemplary embodiment, the light-emitting module 2300 may include a light-emitting device array 2310 and a rank storage unit 2320. The light-emitting device array 2310 may include at least one light-emitting device package and a circuit board. The light-emitting device package may be the light-emitting device package 1000 illustrated in FIG. 8. As in the exemplary embodiments described above, the rank storage unit 2320 may store rank information of the light-emitting device array 2310. The light-emitting device array 2310 may receive power for light emission from a light-emitting device driving unit disposed outside the direct-type backlight assembly 2000. The light-emitting device driving unit may detect the rank information of the light-emitting device array 2310 that is stored in the rank storage unit 2320, and adjust a current or the like supplied to the light-emitting device array 2310, based on the detected rank information.

The optical sheet 2400 may be provided on the light-emitting module 2300 and may include a diffusion sheet 2410, a light concentration sheet 2420, and a protection sheet 2430. That is, the diffusion sheet 2410 that diffuses light emitted from the light-emitting module 2300, the light concentration sheet 2420 that concentrates the light diffused from the diffusion sheet 2410 and increases luminance, and the protection sheet 2430 that protects the light concentration sheet 2420 and secures a viewing angle may be sequentially provided on the light-emitting module 2300.

The upper cover 2600 may cover the edge of the optical sheet 2400 and be assembled with the lower cover 2100.

The liquid crystal panel 2500 may be further provided between the optical sheet 2400 and the upper cover 2600. The liquid crystal panel 2500 may include a pair of substrates, that is, a first substrate (not illustrated) and a second substrate (not illustrated), which are attached to each other, with a liquid crystal layer being disposed therebetween. In the first substrate, a plurality of gate lines and a plurality of data lines interest with each other to define pixel regions. Thin film transistors (TFTs) are provided at intersections of the pixel regions and are respectively connected to pixel electrodes mounted in the pixel regions. The second substrate may include R, G, and B color filters corresponding to the pixel regions, and black matrix that covers the edges of the R, G, and B color filters, the gate lines, the data lines, and the TFTs.

Figure 12:
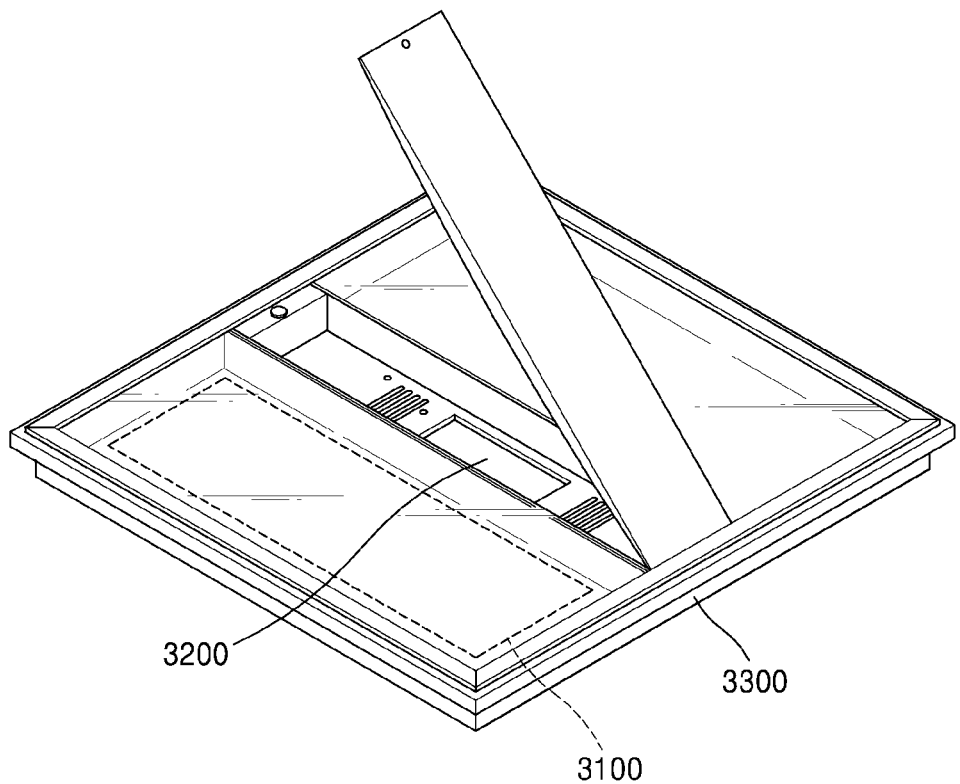
FIG. 12 is a perspective view of a flat-panel lighting apparatus including a light-emitting device array unit, in which light-emitting devices are arranged, and a light-emitting device module, according to an exemplary embodiment of the inventive concept.

FIG. 12 is a perspective view of a flat-panel lighting apparatus 3000 including a light-emitting module and a light-emitting device array unit in which at least one selected from among the light-emitting devices 100, 102, 104, 106, and 108 of FIGS. 2 to 7 is arranged, according to an exemplary embodiment of the inventive concept. The flat-panel lighting apparatus 3000 may include a light source 3100, a power supply 3200, and a housing 3300. In the exemplary embodiment, the light source 3100 may include the light-emitting device array unit, and the power supply 3200 may include the light-emitting device driving unit described above.

The light source 3100 may include the light-emitting device array unit and be formed to have a flat shape as a whole. In the exemplary embodiment, the light-emitting device array unit may include a light-emitting device array and a rank storage unit that stores rank information of the light-emitting device array.

The power supply 3200 may be configured to supply power to the light source 3100. In the exemplary embodiment, the power supply 3200 may include a variable current output unit and a rank detection unit. The variable current output unit and the rank detection unit may perform the same functions as those of a variable current output unit and a rank detection unit included in any one of the exemplary embodiments of the inventive concept. The rank detection unit may include a light, temperature and/or motion sensor. The rank detection unit may store an individual rank of each light source 3100, color information, and color temperature information. Therefore, as described below with reference to FIG. 14, it is possible to control an on/off operation, a color, and a color temperature of the lighting through an in-house home network by using the sensor, the individual rank of the light source, the color information, and the color temperature information.

The housing 3300 may form an accommodation space for accommodating the light source 3100 and the power supply 3200. The housing 3300 is formed to have a hexahedral shape whose one side is opened, but is not limited thereto. The light source 3100 may be disposed to emit light toward the opened side of the housing 3300.

Figure 13:
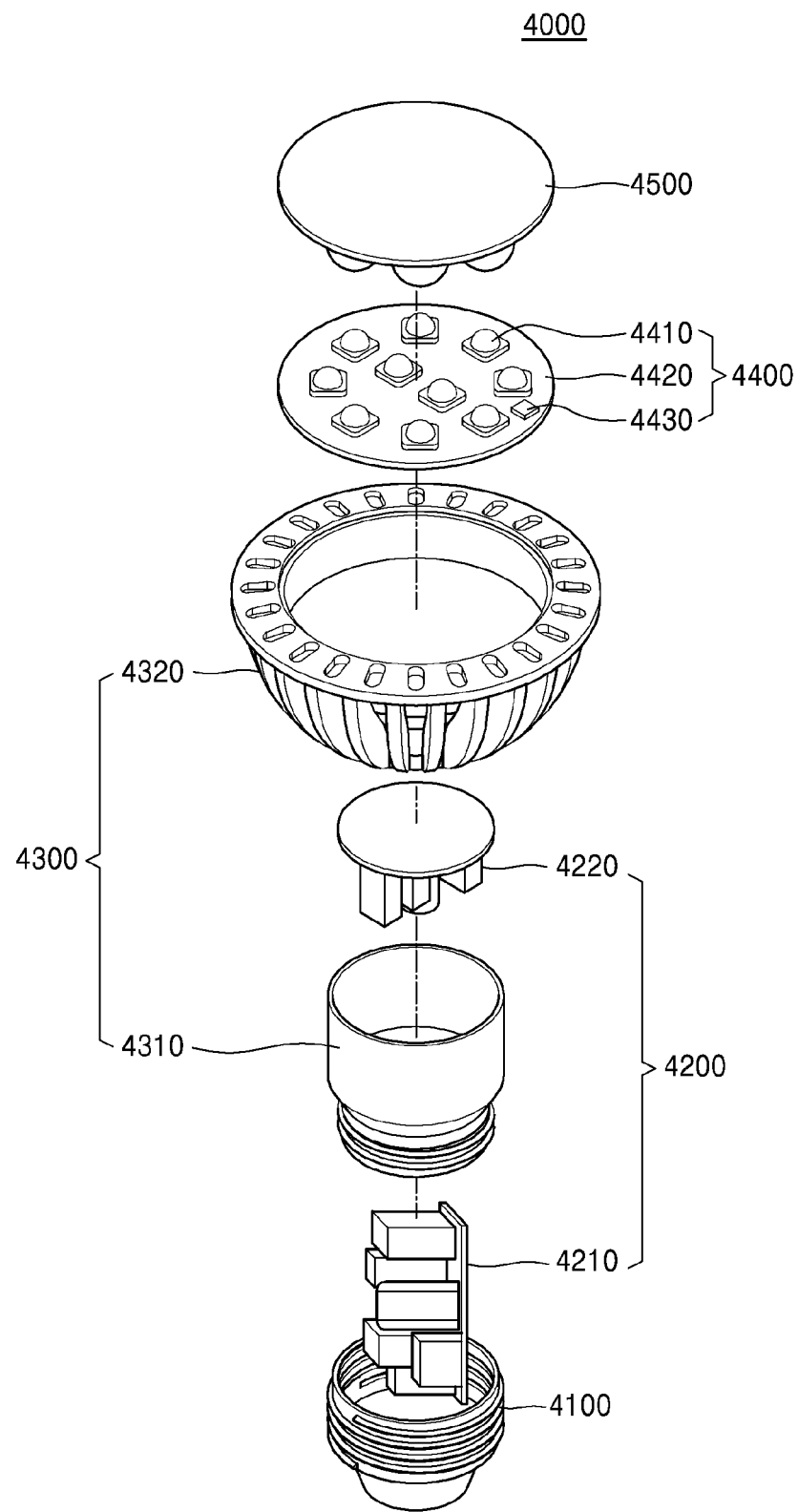
FIG. 13 is an exploded perspective view of a bulb-type lamp including a light-emitting device array unit, in which light-emitting devices are arranged, and a light-emitting device module, according to an exemplary embodiment of the inventive concept.

FIG. 13 is a perspective view of a bulb-type lamp 4000 serving as a lighting apparatus, including a light-emitting module (FIG. 10) and a light-emitting device array unit in which at least one selected from among the light-emitting devices 100, 102, 104, 106, and 108 of FIGS. 2 to 7 is arranged, according to an exemplary embodiment of the inventive concept. The bulb-type lamp 4000 may include a socket 4100, a power supply 4200, a heat sink 4300, a light source 4400, and an optical unit 4500. In the exemplary embodiment, the light source 4400 may include the light-emitting device array unit described above, and the power supply 4200 may include the light-emitting device driving unit described above.

The socket 4100 may be configured to be replaceable with an existing lighting apparatus. Power may be supplied to the bulb-type lamp 4000 through the socket 4100. The power supply 4200 may be dissembled into a first power supply 4210 and a second power supply 4220. The power supply 4200 may include a light-emitting device driving unit according to the exemplary embodiments described above. That is, the power supply 4200 may include a variable current output unit and a rank detection unit. The variable current output unit and the rank detection unit may perform the same functions as those of a variable current output unit and a rank detection unit included in any one of the exemplary embodiments of the inventive concept.

The heat sink 4300 may include an internal heat sink 4310 and an external heat sink 4320. The internal heat sink 4310 may be directly connected to the light source 4400 and/or the power supply 4200. The internal heat sink 4310 may transfer heat to the external heat sink 4320. The optical unit 4500 may include an internal optical unit (not illustrated) and an external optical unit (not illustrated). The optical unit 4500 may be configured to uniformly disperse light emitted from the light source 4400.

The light source 4400 may receive power from the power supply 4200 and emit light to the optical unit 4500. The light source 4400 may include the light-emitting device array unit according to the exemplary embodiments described above. The light source 4400 may include one or more light-emitting device packages 4410, a circuit board 4420, and a rank storage unit 4430. The rank storage unit 4430 may include a light, temperature and/or motion sensor. The rank storage unit 4430 may store individual ranks of the light-emitting device packages 4410, color information, and color temperature information. Therefore, as described below with reference to FIG. 14, it is possible to control an on/off operation, a color, and a color temperature of the lighting through an in-house home network by using the sensor, the individual ranks of the light-emitting device packages 4410, the color information, and the color temperature information. The light-emitting device package 4410 may be the light-emitting device package 1000 illustrated in FIG. 8.

Figure 14:
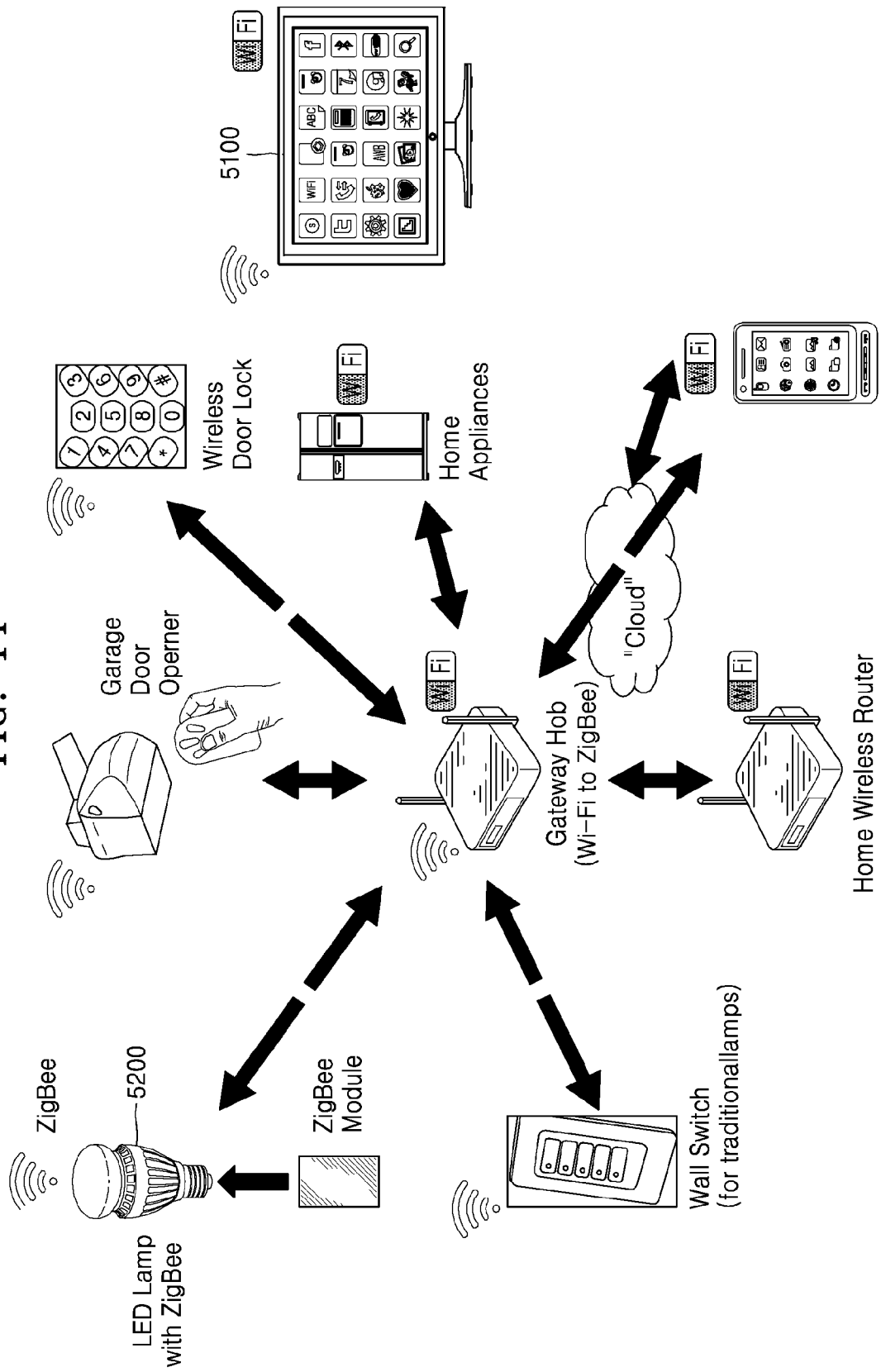
FIG. 14 is a diagram illustrating various examples in which a lamp including a light-emitting device array unit, in which light-emitting devices are arranged, and a light-emitting device module, is applied to a home network, according to an exemplary embodiment of the inventive concept.

FIG. 14 is a diagram illustrating various examples in which a lamp, including a light-emitting device module and a light-emitting device array in which at least one selected from among the light-emitting devices 100, 102, 104, 106, and 108 of FIGS. 2 to 7 is arranged, is applied to a home network, according to an exemplary embodiment of the inventive concept. By using an in-home wireless communication (Zigbee, WiFi, or the like), it is possible to automatically control the on/off operation, brightness, color temperature, and/or color rendering of the lighting according to an operating state of a bedroom, a living room, a door, a storehouse, or home appliances, and a surrounding environment and situation.

For example, as illustrated in FIG. 14, the brightness, color temperature, and/or color rendering of a lamp 5200 may be automatically adjusted according to a kind of a TV program aired on a TV 5100 or a screen brightness of the TV 5100. When a program value of a TV program is a human drama, the lamp 5200 lowers a color temperature to 12000K or less and adjusts a color sense according to a preset value, thus creating a cozy atmosphere. For example, the color temperature of the lamp 5200 may be adjusted to 5000K. On the other hand, when a program value is a gag program, the lamp 5200 increases a color temperature to 5000K or more according to a set value and is adjusted to bluish white light. In addition, by using a smartphone or a computer, it is possible to control the on/off operation, brightness, color temperature, and/or color rendering of the lamp 5200 through an in-home wireless communication protocol (ZigBee, WiFi, LiFi, or the like) and to control home appliances such as the TV 5100, a refrigerator, an air conditioner, or the like, which is connected thereto. The LiFi communication means a near field communication protocol using a visible ray of the lamp 5200.

For example, in-home lamps or home appliances may be controlled using a smartphone by an operation of implementing a lamp control application program of a smartphone displaying color coordinates as illustrated in FIG. 9, an operation of mapping sensors connected to all lamps installed at homes in cooperation with the color coordinates by using ZigBee, WiFi, or LiFi communication protocol, that is, displaying positions of the lamps, a current setting value, and an on/off state value, an operation of selecting a lamp located at a specific position and changing a state value thereof, and an operation of changing a state of the lamp according to the changed value.

Figure 15:
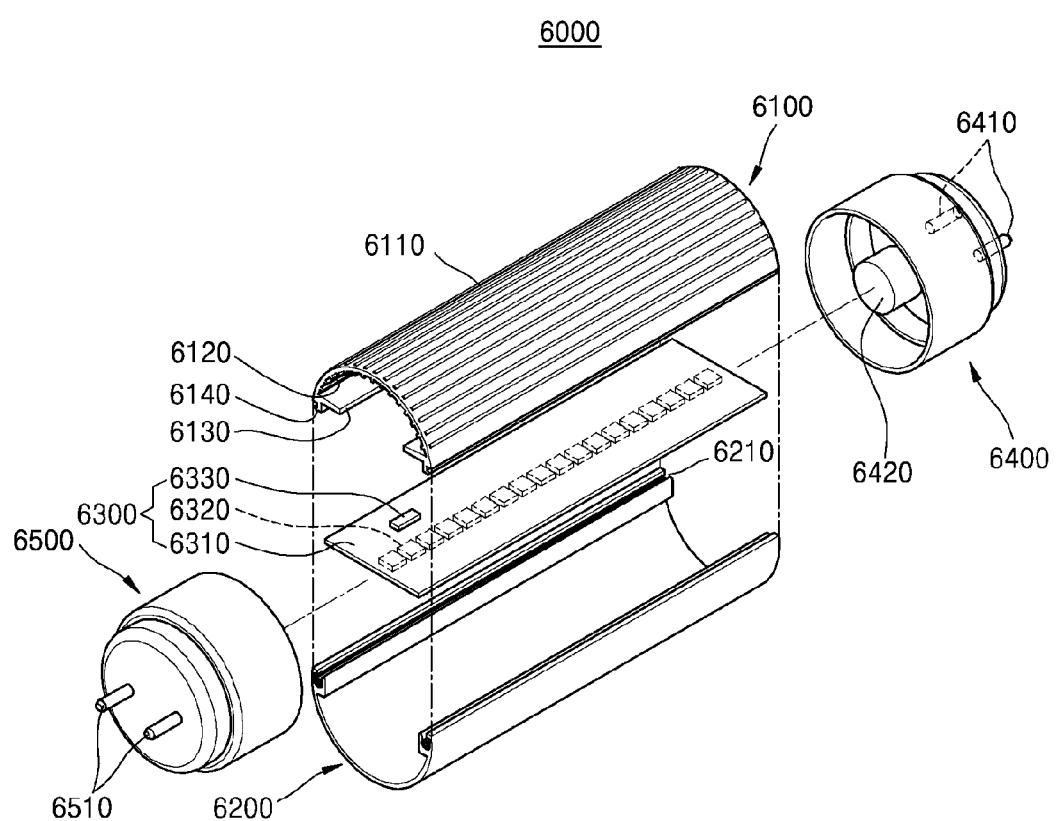
FIG. 15 is an exploded perspective view of a light-emitting apparatus including a light-emitting device array unit, in which light-emitting devices are arranged, and a light-emitting device module, according to an exemplary embodiment of the inventive concept.

FIG. 15 is an exploded perspective view of a light-emitting apparatus 6000, including a light-emitting device module and a light-emitting device array unit in which at least one selected from among the light-emitting devices 100, 102, 104, 106, and 108 of FIGS. 2 to 7 is arranged, according to an exemplary embodiment of the inventive concept. Referring to FIG. 15, the light-emitting apparatus 6000 may include a heat sink member 6100, a cover 6200, a light-emitting module 6300, a first socket 6400, and a second socket 6500.

A plurality of heat sink fins 6110 and 6120 having an uneven shape may be formed on inner or outer surfaces of the heat sink member 6100. The heat sink fins 6110 and 6120 may be designed to have various shapes and intervals. A support 6130 having a protruding shape may be formed inside the heat sink member 6100. The light-emitting module 6300 may be fixed to the support 6130. Locking protrusions 6140 may be formed on both ends of the heat sink member 6100.

Locking grooves 6210 may be formed in the cover 6200. The locking protrusions 6140 of the heat sink member 6100 may be hooked to the locking grooves 6210. The positions of the locking grooves 6210 may be changed with the positions of the locking protrusions 6140.

The light-emitting module 6300 may include the light-emitting device array unit according to the exemplary embodiments described above. The light-emitting module 6300 may include a PCB 6310, a light-emitting device array 6320, and a rank storage unit 6330. As described above, the rank storage unit 6330 may store rank information of the light-emitting device array 6320. Circuit wirings may be formed on the PCB 6310 so as to operate the light-emitting device array 6320. In addition, the PCB 6310 may include components for operating the light-emitting device array 6320.

The first and second sockets 6400 and 6500 are provided as a pair of sockets and are connected to both ends of a cylindrical cover unit including the heat sink member 6100 and the cover 6200.

For example, the first socket 6400 may include an electrode terminal 6410 and a power supply 6420, and the second socket 6500 may include a dummy terminal 6510. The power supply 6420 may include the light-emitting device driving unit according to the exemplary embodiments described above. Specifically, the power supply 6420 may include a variable current output unit and a rank detection unit. The variable current output unit and the rank detection unit may perform the same functions as those of a variable current output unit and a rank detection unit included in any one of the exemplary embodiments of the inventive concept. The rank detection unit may include a light, temperature and/or motion sensor. The rank detection unit may store an individual rank of each light-emitting device of the light-emitting module 6300, color information, and color temperature information. Therefore, as described with reference to FIG. 14, it is possible to control an on/off operation, a color, and a color temperature of the lighting through a home network by using the sensor, the individual rank of the light source, the color information, and the color temperature information.

In addition, a light, temperature and/or motion sensor module may be embedded into the first socket 6400 or the second socket 6500. For example, the light, temperature and/or motion sensor module may be embedded into the second socket 6500 in which the dummy terminal 6510 is disposed. As another example, the light, temperature and/or motion sensor module may be embedded into the first socket 6400 in which the electrode terminal 6410 is disposed. By using the light, temperature and/or motion sensor, the light-emitting apparatus may be applied to the in-house home network described above with reference to FIG. 14.

While the inventive concept has been particularly shown and described with reference to exemplary embodiments thereof, it will be understood that various changes in form and details may be made therein without departing from the spirit and scope of the following claims.

What is claimed is:

1. A light-emitting device comprising:
a substrate;
a light-emitting structure including first and second nitride-based semiconductor layers on the substrate, and an active layer between the first and second nitride-based semiconductor layers;
an insulating layer on a top surface of the light-emitting structure;
a protrusion on the insulating layer, a top surface of the protrusion being smaller than a bottom surface thereof, the protrusion having a trapezoidal cross-section;
a transparent conductive layer covering the top surface of the light-emitting structure, a top surface of the insulating layer, and the top surface of the protrusion; and
an electrode covering at least one of inclined surfaces of the protrusion on the transparent conductive layer,
wherein the electrode has an inclined surface inclined relative to the substrate at a region where the electrode covers the at least one of the inclined surfaces of the protrusion.

2. The light-emitting device of claim 1, wherein the protrusion includes a first side surface inclined at a first angle with respect to the substrate, and a second side surface inclined at a second angle with respect to the substrate, the electrode covers a portion of the top surface of the protrusion and the second side surface of the protrusion, and the first side surface of the protrusion is uncovered by the electrode.

3. The light-emitting device of claim 2, wherein the electrode extends to cover a portion of the top surface of the insulating layer that is adjacent to the second side surface of the protrusion.

4. The light-emitting device of claim 1, wherein the electrode covers a side surface of the protrusion and a portion of the top surface of the insulating layer that is adjacent to the side surface of the protrusion, with the transparent conductive layer being disposed therebetween.

5. The light-emitting device of claim 1, wherein a bottom surface of the electrode has a height of a first level in a first region covering the top surface of the protrusion and has a height of a second level in a second region covering the top surface of the insulating layer, and the height of the first level is higher than the height of the second level.

6. The light-emitting device of claim 1, wherein the protrusion is composed of a same material as the insulating layer.

7. The light-emitting device of claim 1, wherein the protrusion is composed of a same material as the transparent conductive layer.

8. The light-emitting device of claim 1, wherein a cross-sectional area of the top surface of the insulating layer is larger than a cross-sectional area of the bottom surface of the protrusion.

9. The light-emitting device of claim 1, wherein the transparent conductive layer has a constant thickness along the top surface of the light-emitting structure, the top surface of the insulating layer, and the top surface of the protrusion.

10. A light-emitting device comprising:
a light-emitting structure including first and second nitride-based semiconductor layers, and an active layer disposed between the first and second nitride-based semiconductor layers;
an insulating layer formed on the light-emitting structure;
a protrusion protruding from the insulating layer in a direction away from the light-emitting structure, and having first and second inclined surfaces and a top surface intersected by the first and second inclined surfaces;
an electrode covering at least a portion of the second inclined surface and not covering the entire top surface of the protrusion; and
a transparent conductive layer interposed between the electrode and the protrusion, electrically connected to the first nitride-based semiconductor layer, and at least extending between opposite sides of the insulating layer to cover the protrusion and the insulating layer,
wherein the electrode has an inclined surface inclined relative to a substrate at a region where the electrode covers the portion of the second inclined surface.

11. The light-emitting device of claim 10, wherein the first inclined surface of the protrusion is uncovered by the electrode.

12. The light-emitting device of claim 10, wherein the transparent conductive layer has a constant thickness.

13. A light-emitting device comprising:
a light-emitting structure including first and second nitride-based semiconductor layers, and an active layer between the first and second nitride-based semiconductor layers;
an insulating layer on a top surface of the light-emitting structure;
a protrusion protruding from the insulating layer, and having first and second inclined surfaces and a top surface intersected by the first and second inclined surfaces;
a transparent conductive layer covering the top surface of the light-emitting structure, a top surface of the insulating layer, top surfaces of the first and second inclined surfaces, and the top surface of the protrusion; and
an electrode covering at least the first inclined surface of the protrusion on the transparent conductive layer and a portion of the top surface of the protrusion, and having an inclined surface at an interface between the electrode and the inclined surface of the protrusion,
wherein the transparent conductive layer extends continuously from the top surface of the light emitting structure across the first and second inclined surfaces to the top surface of the protrusion.

14. The light-emitting device of claim 13, wherein the electrode extends to cover a portion of the top surface of the insulating layer that is adjacent to the second inclined surface of the protrusion.

15. The light-emitting device of claim 13, wherein the electrode covers portions of the top surface of the insulating layer adjacent to the first and second inclined surfaces, with the transparent conductive layer being disposed therebetween.

16. The light-emitting device of claim 13, wherein a bottom surface of the electrode has a first height of a first level in a first region covering the top surface of the protrusion and has a second height of a second level in a second region covering the top surface of the insulating layer, and the first height is higher than the second height.

17. The light-emitting device of claim 1, wherein a width of a bottom surface of the protrusion is smaller than a width of a top surface of the insulating layer.

18. The light-emitting device of claim 13, wherein a width of a bottom surface of the protrusion is in a range of about 10 μm and about 20 μm and a width of a bottom surface of the insulating layer is in a range of about 100 μm and about 200 μm.

19. The light-emitting device of claim 10, wherein a width of a bottom surface of the protrusion is smaller than a width of a top surface of the insulating layer.

20. The light-emitting device of claim 15, wherein a width of a bottom surface of the protrusion is in a range of about 10 μm and about 20 μm and a width of a bottom surface of the insulating layer is in a range of about 100 μm and about 200 μm.

* * * * *